US009159758B2

United States Patent
Tanaka et al.

(10) Patent No.: US 9,159,758 B2
(45) Date of Patent: Oct. 13, 2015

(54) COLOR IMAGING ELEMENT AND IMAGING DEVICE

(71) Applicant: FUJIFILM Corporation, Tokyo (JP)

(72) Inventors: Seiji Tanaka, Saitama (JP); Kenkichi Hayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,402

(22) Filed: Jan. 5, 2015

(65) Prior Publication Data

US 2015/0109495 A1 Apr. 23, 2015

Related U.S. Application Data

(63) Continuation of application No. PCT/JP2013/068233, filed on Jul. 3, 2013.

(30) Foreign Application Priority Data

Jul. 6, 2012 (JP) ................. 2012-152680

(51) Int. Cl.
  *H04N 9/083* (2006.01)
  *H04N 3/14* (2006.01)
  *H04N 5/335* (2011.01)
  *H04N 9/04* (2006.01)
  *H01L 27/146* (2006.01)

(52) U.S. Cl.
  CPC .......... *H01L 27/14621* (2013.01); *H04N 9/045* (2013.01)

(58) Field of Classification Search
  CPC ............. H04N 9/045; H01L 27/14621; H01L 27/14625
  USPC .................... 348/277, 45, 273, 275
  See application file for complete search history.

(56) References Cited

U.S. PATENT DOCUMENTS

| 5,889,554 A | 3/1999 | Mutze |
| 2002/0149686 A1 | 10/2002 | Taubman |

(Continued)

FOREIGN PATENT DOCUMENTS

| EP | 1793620 A1 | 6/2007 |
| JP | 59-195864 A | 11/1984 |

(Continued)

OTHER PUBLICATIONS

Extended European Search Report dated Aug. 4, 2014, for European Application No. 11859479.5.

(Continued)

*Primary Examiner* — Antoinette Spinks
(74) *Attorney, Agent, or Firm* — Birch, Stewart, Kolasch & Birch, LLP

(57) ABSTRACT

A color filter array is configured with a 3×3 basic array pattern repeatedly disposed in a horizontal and a vertical direction. The basic array pattern is configured with a G filter array formed by disposing a G filter in the horizontal direction, and first and the second RGB filter arrays formed by disposing RGB filters in the horizontal direction. The ratio of the pixel number of the G color is made larger than the ratio of the pixel number of each color of RB. The G filter is disposed in each filter line in the horizontal, vertical and oblique directions of the color filter array. The RB filters are each disposed in one filter line in the vertical direction of the basic array pattern, and any of the RB filters is disposed in other filter lines.

8 Claims, 23 Drawing Sheets

(56) References Cited

U.S. PATENT DOCUMENTS

| | | |
|---|---|---|
| 2006/0119738 A1 | 6/2006 | Kido |
| 2008/0128598 A1 | 6/2008 | Kanai et al. |
| 2009/0200451 A1 | 8/2009 | Conners |
| 2012/0293694 A1* | 11/2012 | Hayashi et al. ............... 348/280 |
| 2012/0293696 A1* | 11/2012 | Tanaka ........................... 348/280 |
| 2014/0111673 A1* | 4/2014 | Hayashi ......................... 348/280 |

FOREIGN PATENT DOCUMENTS

| JP | 2-210996 A | 8/1990 |
|---|---|---|
| JP | 8-23543 A | 1/1996 |
| JP | 11-285012 A | 10/1999 |
| JP | 2000-308080 A | 11/2000 |
| JP | 2005-136766 A | 5/2005 |
| JP | 2006-165975 A | 6/2005 |
| JP | 2007-274632 A | 10/2007 |

OTHER PUBLICATIONS

Extended European Search Report dated Jan. 27, 2015, for European Application No. 12804973.1.

Extended European Search Report dated Oct. 28, 2014, for European Application No. 11859950.5.

Hirakawa et al., "Spatio-Spectral Color Filter Array Design for Optimal Image Recovery", IEEE Transactions on Image Processing, vol. 17, No. 10, Oct. 2008, pp. 1876-1890.

International Search Report issued in PCT/JP2013/068233, dated Sep. 17, 2013.

Written Opinion of the International Searching Authority issued in PCT/JP2013/068233, dated Sep. 17, 2013.

* cited by examiner

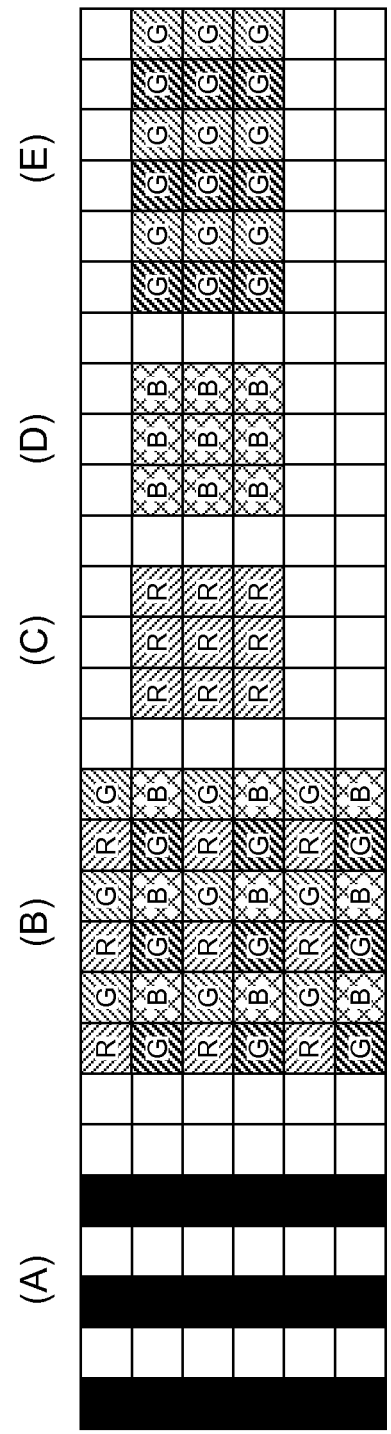

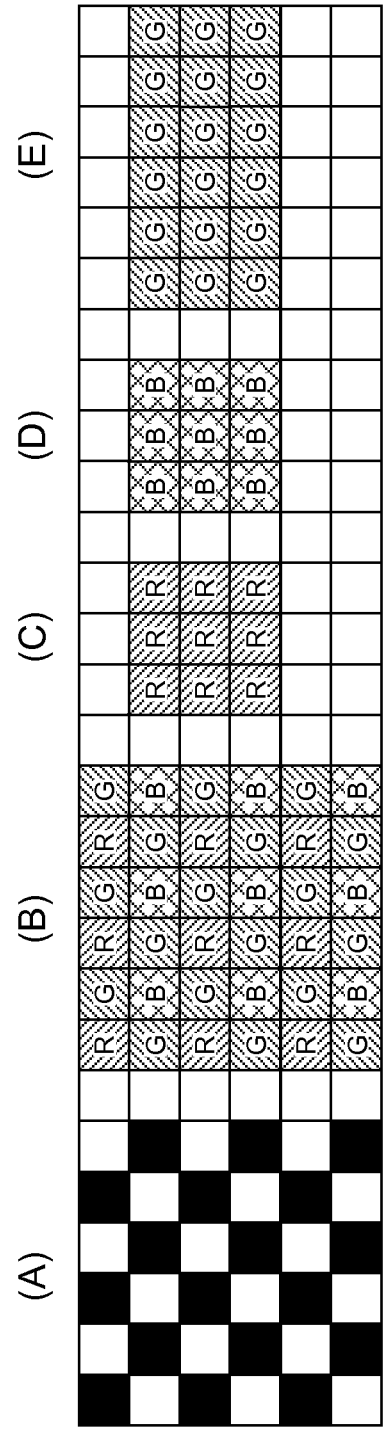

COLOR IMAGING ELEMENT AND IMAGING DEVICE

CROSS-REFERENCE TO RELATED APPLICATIONS

This application is a Continuation of PCT International Application No. PCT/JP2013/068233 filed on Jul. 3, 2013, which claims priority under 35 U.S.C §119(a) to Japanese Patent Application No. 2012-152680 filed on Jul. 6, 2012. Each of the above applications is hereby expressly incorporated by reference, in their entirety, into the present application.

BACKGROUND OF THE INVENTION

1. Field of the Invention

The present invention relates to a single-plate color imaging element in which a color filter is arranged on a pixel, and an imaging device including such a color imaging element.

2. Description of the Related Art

In the single-plate color imaging element, since the monochromatic color filter is set on each pixel, each pixel has only monochrome color information. Therefore, since the output image of the single-plate color imaging element is a RAW image (mosaic image), a multi-channel image is acquired by processing (demosaicing process) that interpolates a missing color pixel with a surrounding pixel. In this case, there is a problem in the reproduction characteristics of image signals of high frequency.

In a primary color Bayer array that is a color array of a color filter that is used in the single-plate color imaging element most widely, since green (G) pixels are disposed in a checkered pattern and red (R) and blue (B) are disposed in a line-sequential manner, there is a problem in the reproduction precision when generating a high frequency signal in which G signals are in the oblique direction and R and B signals are in the horizontal and vertical directions.

In a case where a black-and-white stripe pattern (high-frequency image) as illustrated in portion (A) of FIG. 21 enters a color imaging element having a color filter of the Bayer array illustrated in portion (B) of FIG. 21, when this is distributed according to the Bayer color array and comparison is performed in each color, as illustrated in portions (C) to (E) of FIG. 21, R becomes a mosaic color image of light and flat, B becomes a mosaic color image of dark and flat, and G becomes a mosaic color image of light and shade. That is, it is originally a black-and-white image and the concentration difference (level difference) is not caused among RGB, but it enters a state where the image is colored by the color array and input frequency.

Similarly, in a case where an oblique black-and-white high-frequency image as illustrated in portion (A) of FIG. 22 enters an imaging element having a color filter of the Bayer array illustrated in portion (B) of FIG. 22, when this is distributed according to the Bayer color array and comparison is performed in each color, as illustrated in portions (C) to (E) of FIG. 22, R and B become a color image of light and flat and G becomes a color image of dark and flat. If the value of the black is assumed to be 0 and the value of the white is assumed to be 255, only G becomes 255 and therefore the oblique black-and-white high-frequency image becomes green. Thus, in the Bayer array, it is not possible to correctly reproduce an oblique high-frequency image.

In general, it is avoided by disposing an optical low-pass filter including a birefringent material such as crystal in front of the color imaging element and optically decreasing the high frequency in the imaging device using single-plate color imaging elements. However, it is possible to mitigate coloring by the aliasing of high-frequency signals in this method, but there is a problem that the resolution degrades due to the negative effect.

To solve such a problem, there is suggested a color imaging element where the color filter array of the color imaging element is assumed to be a three-color random array satisfying array restriction conditions in which an arbitrary target pixel is adjacent to three colors including the color of the target pixel on any of four sides of the target pixel (Japanese Patent Application Laid-Open No. 2000-308080: PTL 1).

Moreover, there is suggested an image sensor of a color filter array (color imaging element) where the image sensor includes a plurality of filters with different spectral sensitivities, and a first filter and the a second filter among them are alternately disposed in a first predetermined period in one diagonal direction of a pixel grid of the image sensor and are alternately disposed in a second predetermined period in the other diagonal direction (Japanese Patent Application Laid-Open No. 2005-136766: PTL 2).

In addition, there is suggested a color array where, in a color solid-state imaging element of three primary colors of RGB (color imaging element), a set of three pixels in which R, G and B are horizontally disposed are disposed in a zigzag manner in the vertical direction to make the appearance probabilities of RGB respectively equal and to cause an arbitrary line (horizontal, vertical and oblique lines) on an imaging plane to pass through all colors (Japanese Patent Application Laid-Open No. 11-285012: PTL 3).

Furthermore, there is suggested a color imaging element where R and B among the three primary colors of RGB are disposed every three pixels in the horizontal and vertical directions and G is disposed between R and B (Japanese Patent Application Laid-Open No. 8-23543: PTL 4).

SUMMARY OF THE INVENTION

In the color imaging element described in PTL 1, since the color filter array is random, when demosaicing process is performed in a subsequent stage, optimization has to be performed every random pattern, and there is a problem that the demosaicing process becomes complex. Here, the demosaicing process denotes processing that calculates color information on all of the RGB pixels from the mosaic images of RGB according to the color filter array of the single-plate color imaging element (conversion into a simultaneous type), and also denotes demosaicing processing or synchronization processing (which are the same in this specification).

Moreover, in the color imaging element described in PTL 2, since the G pixels (brightness pixels) are disposed in a checkered pattern, there is a problem that the pixel reproduction precision in a limit resolution area (especially in an oblique direction) is not good.

In the color imaging element described in PTL 3, since the ratios of RGB pixel numbers are equal, there is a problem that the high-frequency reproducibility deteriorates as compared with the Bayer array. Here, in the case of the Bayer array, the ratio of the pixel number of G that contributes most to acquire a brightness signal is twice the pixel number of each of R and B.

Meanwhile, in the color imaging element described in PTL 4, the ratio of the G pixel number is six times the pixel number of each of R and B and is substantially higher than the Bayer array, and the color reproducibility degrades. Moreover, in the color filter array of the color imaging element described in PTL 4, since an array pattern corresponding to 6×4 pixels is repeatedly disposed in the horizontal direction, when the demosaicing process is performed in a subsequent stage, it is possible to perform the processing according to the repeating array pattern. Therefore, it is possible to simplify processing in the subsequent stage as compared with the color filter array of PTL 1.

However, the repeating array pattern forming the color filter array in PTL 4 is a relatively large size of 6×4, and, as the size of this repeating array pattern increases, signal processing such as demosaicing becomes complicated. As a result, there is a limit in the simplification of processing in the subsequent stage even if the color imaging element in PTL 4 is used.

The present invention is made in view of such circumstances, and it is an object to provide a color imaging element that can improve the reproduction characteristics of image signals of high frequency at the time of demosaicing process and simplify processing in the subsequent stage as compared with the related art. Moreover, it is an object of the present invention to provide an imaging device using such a color imaging element.

A color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filter includes a basic array pattern in which the color filters are arrayed in an array pattern corresponding to N×N (N is a natural number equal to or greater than 3) pixels in the first direction and the second direction, and the array is formed by repeatedly disposing the basic array pattern in the first direction and the second direction; the color filters include a first filter corresponding to a first color of one or more colors and second filters corresponding to second colors of two or more colors whose contribution ratio to acquire a brightness signal is lower than the first color, and a ratio of all pixel numbers of the first color corresponding to the first filter is larger than a ratio of a pixel number of each color of the second colors corresponding to the second filters; the basic array pattern includes a first filter array of one line formed by arraying the first filter along the first direction and second filter arrays of two or more lines formed by arraying the first filter and the second filter corresponding to each color of the second colors along the first direction; one or more first filters are disposed in a filter line in each direction including the first direction and the second direction of the array of the color filters, and a third direction and a fourth direction that incline to the first direction and the second direction; and one or more second filters of at least one color among each color of the second colors are disposed in a filter line in the second direction of the basic array pattern.

Moreover, a color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filter are arrayed in an array pattern corresponding to N×N (N is a natural number equal to or greater than 3) pixels in the first direction and the second direction, and the array is formed by repeatedly disposing the basic array pattern in the first direction and the second direction; the color filters include a first filter corresponding to a first color of one or more colors whose transmittance peak is within a wavelength range from 480 nm or more to 570 nm or less, and second filters corresponding to second colors of two or more colors whose transmittance peak is outside the range, and a ratio of all pixel numbers of the first color corresponding to the first filter is larger than a ratio of a pixel number of each color of the second colors corresponding to the second filters; the basic array pattern includes a first filter array of one line formed by arraying the first filter along the first direction and second filter arrays of two or more lines formed by arraying the first filter and the second filter corresponding to each color of the second colors along the first direction; one or more first filters are disposed in a filter line in each direction including the first direction and the second direction of the array of the color filters, and a third direction and a fourth direction that incline to the first direction and the second direction; and one or more second filters of at least one color among each color of the second colors are disposed in a filter line in the second direction of the basic array pattern.

Moreover, a color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is a natural number equal to or greater than 3) pixels in the first direction and the second direction, and the array is formed by repeatedly disposing the basic array pattern in the first direction and the second direction; the color filters include a first filter corresponding to a first color of one or more colors and second filters corresponding to second colors of two or more colors whose transmittance is lower than that of the first filter within a wavelength range from 500 nm or more to 560 nm or less, and a ratio of all pixel numbers of the first color corresponding to the first filter is larger than a ratio of a pixel number of each color of the second colors corresponding to the second filters; the basic array pattern includes a first filter array of one line formed by arraying the first filter along the first direction and second filter arrays of two or more lines formed by arraying the first filter and the second filter corresponding to each color of the second colors along the first direction; one or more first filters are disposed in a filter line in each direction including the first direction and the second direction of the array of the color filters, and a third direction and a fourth direction that incline to the first direction and the second direction; and one or more second filters of at least one color among each color of the second colors are disposed in a filter line in the second direction of the basic array pattern.

Moreover, a color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is a natural number equal to or greater than 3) pixels in the first direction and the second direction, and the array is formed by repeatedly disposing the basic array pattern in the first direction and the second direction; the color filters include first filters corresponding to first colors of two or more colors including a color that most contributes to a brightness signal among three primary colors and a fourth color that is a different color from the three primary colors, and second filters corresponding to second colors of two or more colors other than the first colors, and a ratio of all pixel numbers of each color of the first colors corresponding to the first filters is larger than a ratio of a pixel number of each color of the second colors corresponding to the second filters; the basic array pattern includes a first filter array of one line formed by arraying the first filter of one or more colors along the first direction and a second filter array of two or more lines formed by arraying the first filter of one or more colors and the second filter corresponding to each color of the second colors along the first direction; one or more first filters are disposed in a filter line in each direction including the first direction and the second direction of the array of the color filters, and a third direction and a fourth direction that incline to the first direction and the second direction; and one or more second filters of at least one color among each color of the second colors are disposed in a filter line in the second direction of the basic array pattern.

According to the present invention, since one or more first filters are disposed in the filter line in each direction of the first to fourth directions of the array of the color filter, it is possible to improve reproduction precision of demosaicing processing in a high-frequency area.

Moreover, since the basic array pattern of the array of the color filters is repeatedly disposed in the horizontal direction and the vertical direction, when the demosaicing processing in the subsequent stage is performed, it is possible to perform the processing according to the repeating pattern. Especially, in a basic array pattern corresponding to 3×3 pixels or 4×4 pixels, as compared with a case where a random array in the related art or the array of the color filter formed with a repeating array pattern of a large size is used, it is possible to simplify the processing in the subsequent stage.

Moreover, since the ratio of the pixel number of the first color corresponding to the first filter is made larger than the ratio of the pixel number of each color of the second colors corresponding to the second filters, the aliasing can be suppressed and the high-frequency reproducibility is also good.

Moreover, since one or more second filters of at least one color among each color of the second colors are disposed in a filter line in the second direction of the basic array pattern, it is possible to reduce the occurrence of color moire (false color) and prevent the degradation of resolution.

It is preferable that the contribution ratio of the first color to acquire a brightness signal is equal to or greater than 50% and the contribution ratio of the second colors to acquire the brightness signal is less than 50%. Since one or more first filters whose contribution ratio to acquire a brightness signal is higher than that of the second filter are disposed in the filter line in each direction of the first to fourth directions of the array of the color filter, it is possible to improve the reproduction precision of demosaicing processing in a high-frequency area.

It is preferable that a position of the second filter of an identical color in each of the second filter array of two lines of the basic array pattern is shifted by one-pixel interval in the first direction and disposed, and, in at least one filter line among each filter line in the second direction in the basic array pattern, one or more second filters corresponding to each color of the second colors are disposed. It is possible to reduce the occurrence of color moire (false color) and prevent degradation of resolution.

It is preferable that the second filters of different colors are disposed so as to be adjacent to the first direction in the second filter array. It is possible to dispose RB filters that are the second filters of different colors in one filter line among each filter line in the second direction and dispose any one of the RB filters in the remaining lines.

It is preferable that the array of the color filters includes two kinds of the basic array patterns in which a position relationship of the second filter of each color of the second colors is reversed, and the array is formed by disposing these two kinds of the basic array patterns in each direction of the first direction and the second direction alternately and repeatedly. By this means, since one or more second filters of each color of the second colors are disposed in each filter line in the second direction of the array of the color filter, it is possible to reduce the occurrence of color moire (false color) and prevent the degradation of resolution.

It is preferable that, when the color filter is a square shape, the third direction and the fourth direction are different by 45° with respect to the first direction and the second direction respectively.

It is preferable that the first colors include at least any of green and transparency. Moreover, it is preferable that the second colors include red and blue.

An imaging device to achieve the object of the present invention includes: an imaging optical system; a color imaging element in which an object image is formed through the imaging optical system; and an image data generation unit configured to generate image data of the formed object image, where the color imaging element is a color imaging element according to any of the above-mentioned modes.

Since the color imaging element and imaging device of the present invention includes a color filter array in which a basic array pattern is repeatedly disposed in the first direction and the second direction, it is possible to perform processing according to the repeating pattern when performing demosaicing process in a subsequent stage, and it is possible to simplify processing in the subsequent stage as compared with a random array in the related art. Since it is possible to perform signal processing such as demosaicing more easily as the size of the basic array pattern (repeating pattern) becomes small, in the present invention, it is possible to further simplify processing in the subsequent stage as compared with a case where a color filter array including the random array in the related art and a large-size repeating array pattern is used.

Moreover, the first filter is disposed in the line of each direction of the first to fourth directions of a color filter array and the ratio of the pixel number of the first color corresponding to the first filter is made larger than the ratios of the pixel numbers of the second colors that are two or more colors excluding the first color and correspond to the second filter, it is possible to improve the reproduction precision of demosaicing process in a high-frequency area and suppress aliasing.

Moreover, since the second filter of each color of the second colors is disposed in two filter lines of each filter line of the first direction of the basic array pattern and the second filter of at least one color of each color of the second colors is disposed in each filter line of the second direction, it is possible to reduce the occurrence of color moire (false color) and prevent the degradation of resolution.

BRIEF DESCRIPTION OF THE DRAWINGS

FIG. 21 is a diagram used to describe a problem of a color imaging element having a color filter of a Bayer array in the related art; and FIG. 22 is another diagram used to describe a problem of a color imaging element having a color filter of a Bayer array in the related art.

DETAILED DESCRIPTION OF EXEMPLARY EMBODIMENTS

[Entire Configuration of Digital Camera]

Figure 1:
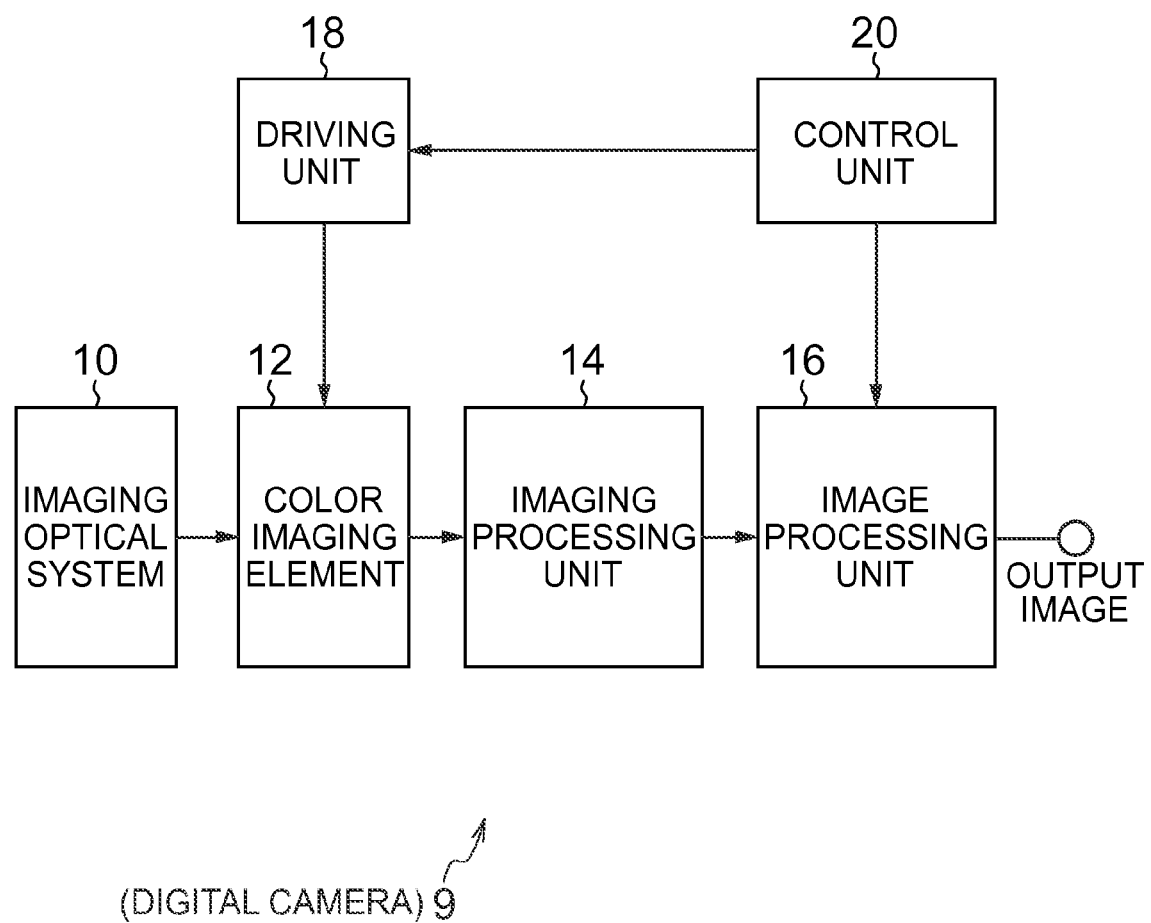
FIG. 1 is a block diagram illustrating an electrical configuration of a digital camera.

FIG. 1 is a block diagram of a digital camera 9 (imaging device) including a color imaging element according to the present invention. The digital camera 9 roughly includes an imaging optical system 10, a color imaging element 12, an imaging processing unit 14, an image processing unit 16, a driving unit 18 and a control unit 20.

The imaging optical system 10 forms an object image on an imaging surface of the color imaging element 12. The color imaging element 12 is a so-called single-plate color imaging element including multiple pixels formed with photoelectric conversion elements two-dimensionally arrayed on the imaging surface, and a color filter provided above the light receiving surface of each pixel. Here, "on" and "above" indicate the direction on the side on which object light enters the imaging surface of the color imaging element 12.

The object image formed on the color imaging element 12 is converted into a signal charge corresponding to the amount of incident light by the photoelectric conversion element of each pixel. The signal charge accumulated in each photoelectric conversion element is sequentially read from the color imaging element 12 as a voltage signal (image signal) corresponding to the signal charge on the basis of a drive pulse given from the driving unit 18 according to an instruction of the control unit 20. The image signals read out from the color imaging element 12 are R, G and B signals showing the mosaic images of red (R), green (G) and blue (B) corresponding to the color filter array of the color imaging element 12. Here, the color imaging element 12 may be other kinds of imaging elements such as a CCD (Charge Coupled Device) imaging element and a CMOS (Complementary Metal Oxide Semiconductor) imaging element.

The image signals read out from the color imaging element 12 are input in the imaging processing unit 14 (image data generation unit). The imaging processing unit 14 includes a correlation double sampling circuit (CDS) to remove reset noise included in the image signals, an AGC circuit to amplify the image signals and control them to be a certain level, and an A/D converter. This imaging processing unit 14 outputs RAW data, which is formed by performing correlation double sampling processing on the input image signals and amplifying and converting them into digital image signals, to the image processing unit 16. Here, in a case where the color imaging element 12 is an MOS imaging element, the A/D converter is often built into in the imaging element, and there may be a case where the above-mentioned correlation double sampling is not required.

The image processing unit 16 (image data generation unit) includes a white balance correction circuit, a gamma correction circuit, a demosaicing process circuit (a processing circuit that calculates color information on all of the RGB pixels from the mosaic images of RGB according to the color filter array of the single-plate color imaging element 12 (conversion into a simultaneous type)), a brightness/color difference signal generation circuit, an outline correction circuit and a color correction circuit, and so on. The image processing unit 16 applies necessary signal processing to the RAW data of mosaic images input from the imaging processing unit 14 according to an instruction from the control unit 20, generates RGB pixel signals having color information on all of the RGB pixels, and, based on this, generates image data (YUV data) formed with brightness data (Y data) and color difference data (Cr and Cb data).

As for the image data generated in the image processing unit 16, a still image is subjected to compression processing in accordance with the JPEG standards by a compression/extension processing circuit, and a moving image is subjected to compression processing in accordance with the MPEG2 standards and subsequently recorded in unillustrated recording media (for example, a memory card) or output to and displayed on display means (not illustrated) such as a liquid crystal monitor. Here, in the present embodiment, the recording media are not limited to the one attachable to and detachable from the digital camera 9 and may be built-in magneto-optic recording media, and the display means is not limited to the one included in the digital camera 9 and may be an external display connected with the digital camera 9.

[Color Imaging Element]

Figure 2:
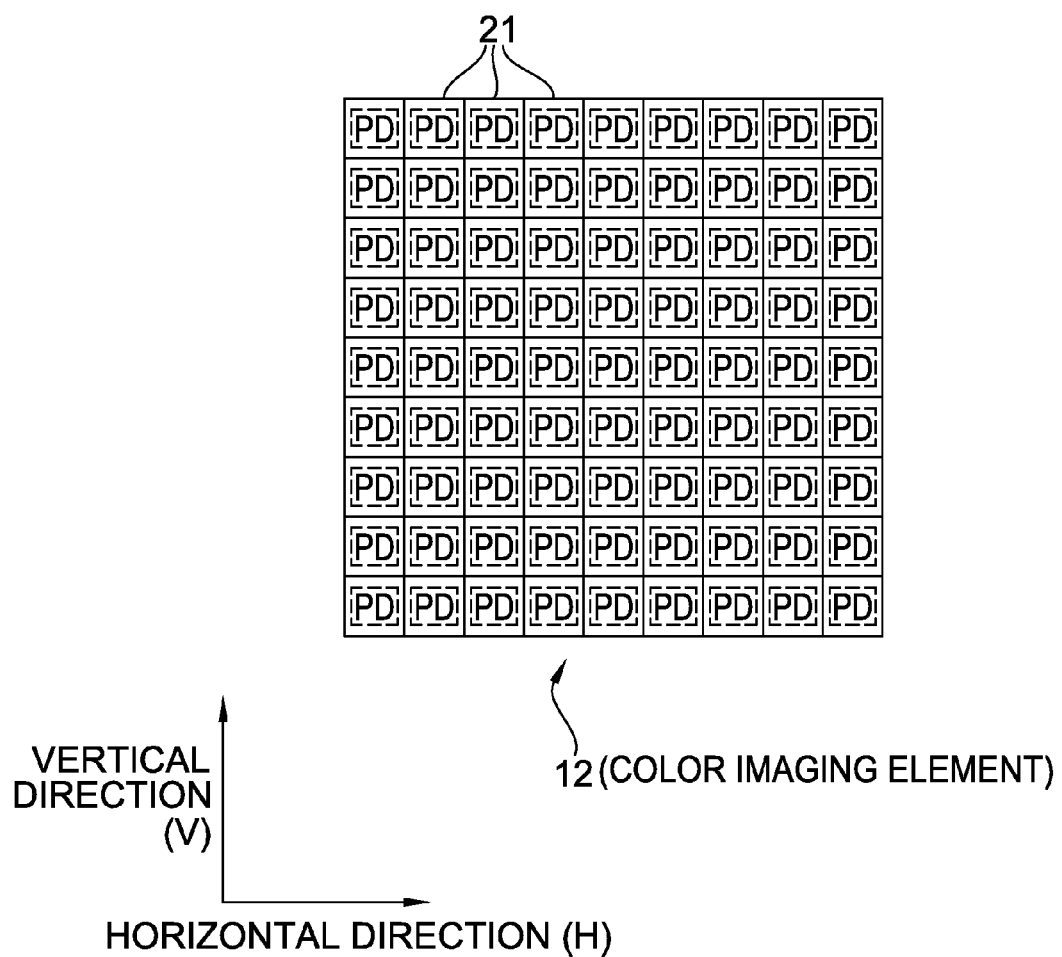
FIG. 2 is a front view of an imaging surface of a color imaging element.

As illustrated in FIG. 2, multiple pixels 21 formed with photoelectric conversion elements PD two-dimensionally arrayed in the horizontal direction and vertical direction are installed in the imaging surface of the color imaging element 12. Here, the horizontal direction corresponds to one direction of the first direction and second direction of the present invention, and the vertical direction corresponds to the other direction of the first direction and second direction of the present invention.

Figure 3:
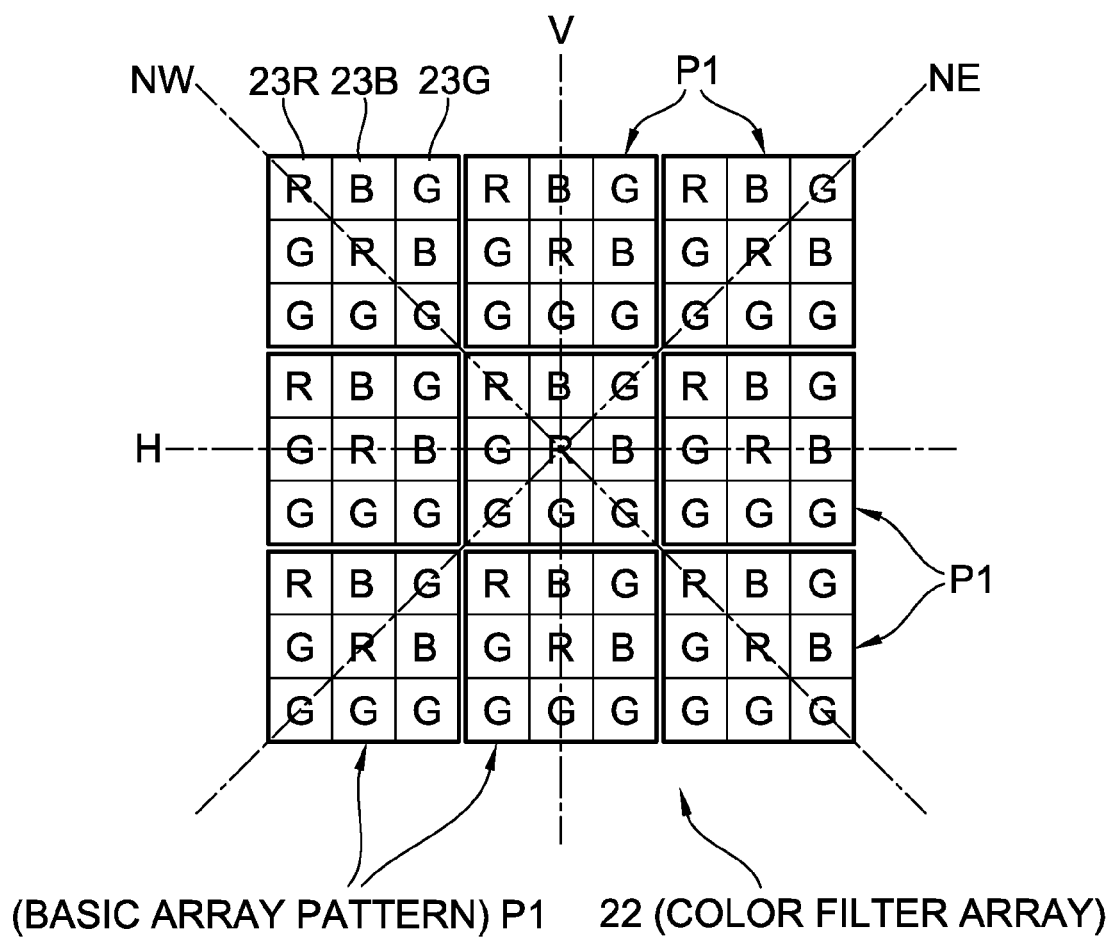
FIG. 3 is a front view of a color filter array of the first embodiment.

As illustrated in FIG. 3, a color filter array 22 formed with the color filter arranged on each pixel 21 is provided on the imaging surface of the color imaging element 12. The color filter array 22 is formed with color filters (hereinafter referred to as "R filter", "G filter" and "B filter") 23R, 23G and 23B of three primary colors of red (R), green (G) and blue (B). Further, any of RGB filters 23R, 23G and 23B is disposed on each pixel 21. In the following, a pixel on which the R filter 23R is disposed is referred to as "R pixel", a pixel on which the G filter 23G is disposed is referred to as "G pixel", and a pixel on which the B filter 23B is disposed is referred to as "B pixel".

Here, the G color corresponds to the first color of the present invention, and the G filter 23G corresponds to the first filter of the present invention. Moreover, the R color and the B color correspond to the second color of the present invention, and RB filters 23R and 23B correspond to the second filter of the present invention. Any of the R filter 23R and the B filter 23B which belong to the second color filter is also referred to as "RB filter" below.

[Color Filter Array of the First Embodiment]

The color filter array 22 has following features (1), (2), (3), (4), (5) and (6).

[Feature (1)]

Figure 4:
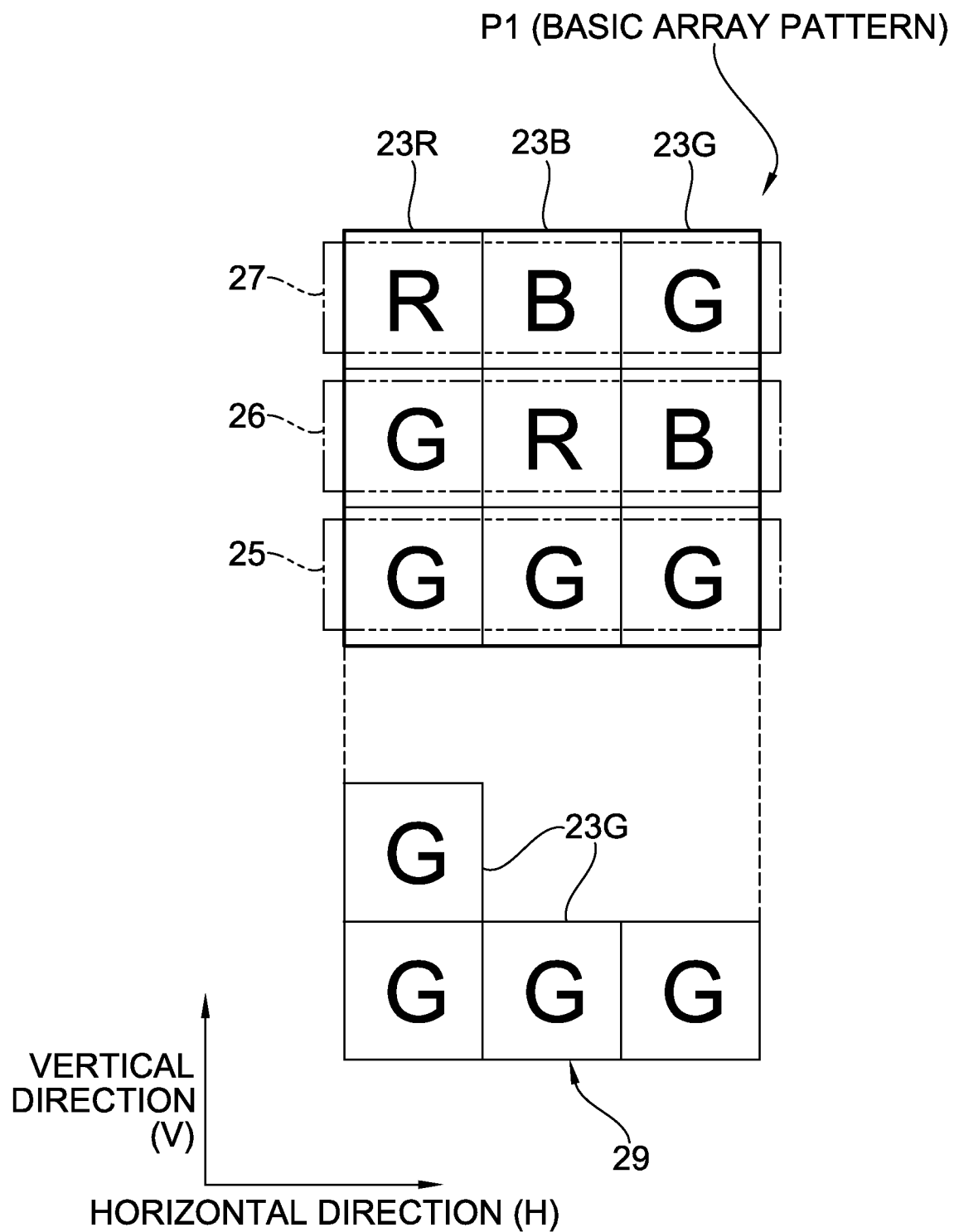
FIG. 4 is an enlarged view of a basic array pattern in FIG. 3.

As illustrated in FIGS. 3 and 4, the color filter array 22 includes a basic array pattern P1 that is a square array pattern corresponding to 3×3 pixels, and this basic array pattern P1 is repeatedly disposed on the horizontal direction (H) and the vertical direction (V). Therefore, the R filter 23R, the G filter 23G and the B filter 23B of the respective colors are arrayed in a predetermined period in the color filter array 22. Therefore, when performing demosaicing process or the like on R, G and B signals read out from the color imaging element 12, it is possible to perform processing according to a repeating pattern. As a result, it is possible to simplify processing in the subsequent stage as compared with a random array in the related art.

Moreover, in a case where thinning processing is performed in units of the basic array pattern P1 to reduce an image, a color filter array after the thinning processing can be assumed to be the same as a color filter array before the thinning processing, and it is possible to use a common processing circuit.

The basic array pattern P1 includes a G filter array 25, a first RGB filter array 26 and a second RGB filter array 27 that are parallel to the horizontal direction, and the respective filter arrays 25 to 27 are arrayed in the vertical direction (see FIG. 4). The G filter array 25 corresponds to the first filter array of the present invention and is formed by arraying three G filters 23G in the horizontal direction. The first and second RGB filter arrays 26 and 27 correspond to the second filter array of the present invention and are formed by arraying the RGB filters 23R, 23G and 23B in the horizontal direction. In the respective filter arrays 25 to 27, the disposition of the RGB filters 23R, 23G and 23B is decided to satisfy the following features (2) to (6).

[Feature (2)]

In the color filter array 22, the G filter 23G is disposed in each filter line in the horizontal (H), vertical (V) and oblique (NE, NW) directions. Here, NE means the diagonally upper light (lower left) direction and corresponds to one direction of a third direction and a fourth direction of the present invention. Moreover, NW means the diagonally lower right (upper left) direction and corresponds to the other direction of the third direction and fourth direction of the present invention. Since RGB filters 23R, 23G and 23B are square shapes, the NE direction and the NW direction are directions of 45° with respect to the horizontal direction and the vertical direction respectively. Here, this angle may increase or decrease according to an increase or decrease in the length of each side in the horizontal direction and vertical direction of the RGB filters 23R, 23G and 23B. For example, in a case where a color filter of a rectangle shape different from the square shape is used, the diagonal line directions are the oblique direction (NE and NW directions). Here, even if the color filter has the rectangle shape different from the square shape, in a case where this color filter or a pixel is disposed in a square grid shape, the NE direction and the NW direction are directions of 45° with respect to the horizontal direction and the vertical direction respectively. In addition, in a case where multiple pixels and color filters are arrayed in a rectangular grid shape, the diagonal line direction of the rectangular lattice corresponds to the oblique directions (NE and NW directions).

As for the G color, the contribution ratio to acquire a brightness (Y) signal (above-mentioned brightness data) is higher than that of the R color and the B color. That is, the contribution ratio in the R color and the B color is lower than that of the G color. When a specific explanation is given, the image processing unit 16 mentioned above generates a Y signal from RGB pixel signals having color information on all of the RGB pixels, according to following equation (1). Following equation (1) is an equation generally used to generate the Y signal in the color imaging element 12. In this equation (1), since the contribution ratio of the G color to a brightness signal becomes 60%, the G color has a higher contribution ratio than that of the R color (contribution ratio of 30%) and the B color (contribution ratio of 10%). Therefore, the G color is a color that most contributes to the brightness signal among three primary colors.

$$Y=0.3R+0.6G+0.1B \qquad \text{Equation (1)}$$

Since such the G filter 23G is disposed in each filter line of the horizontal (H), vertical (V) and oblique (NE, NW) directions of the color filter array 22, it is possible to improve the reproduction precision of demosaicing process in a high-frequency area without depending on the direction of high frequency in an input image.

[Feature (3)]

The numbers of pixels of the R pixel, G pixel and B pixel corresponding to the RGB filters 23R, 23G and 23B in the basic array pattern P1 are 2 pixels, 5 pixels and 2 pixels respectively. Therefore, since the ratio of the respective pixel numbers of the RGB pixels is 2:5:2, the ratio of the pixel number of the G pixel that most contributes to acquire a brightness signal is higher than the ratio of the respective pixel numbers of the R pixel and the B pixel.

Thus, since the ratio of the pixel number of the G pixel and the ratios of respective pixel numbers of the R and B pixels are different, especially, since the ratio of the pixel number of the G pixel that most contributes to acquire the brightness signal is made larger than the ratios of respective pixel numbers of the R and B pixels, it is possible to suppress aliasing at the time of demosaicing process and improve the high-frequency reproducibility. Moreover, the ratio of the G, R and B pixels is close to the ratio in a Bayer array, and the color reproducibility is also good.

[Feature (4)]

The basic array pattern P1 includes a G filter group 29 including each G filter 23G of the G filter array 25 and the G filter 23G in the first RGB filter array 26 adjacent to this. By extracting each G pixel corresponding to this G filter group 29 and calculating the difference absolute value of the pixel value of the G pixel in the horizontal direction (H) and the difference absolute value of the pixel value of the G pixel in the vertical direction (V), it is possible to determine that there is correlation in the direction with the smaller difference absolute value out of the horizontal direction (H) and the vertical directions (V). As a result, in the color filter array 22, it is possible to use information on the G pixels at minimum pixel intervals and determine the direction with the higher correlation out of the horizontal direction (H) and the vertical direction (V). This direction determination result can be used for processing (demosaicing process) that performs interpolation from peripheral pixels. Here, in this case, for example, a direction determination unit may be installed in the above-mentioned demosaicing process circuit (image processing unit 16) and the direction determination may be performed in this direction determination unit.

[Features (5) and (6)]

Figure 5A:
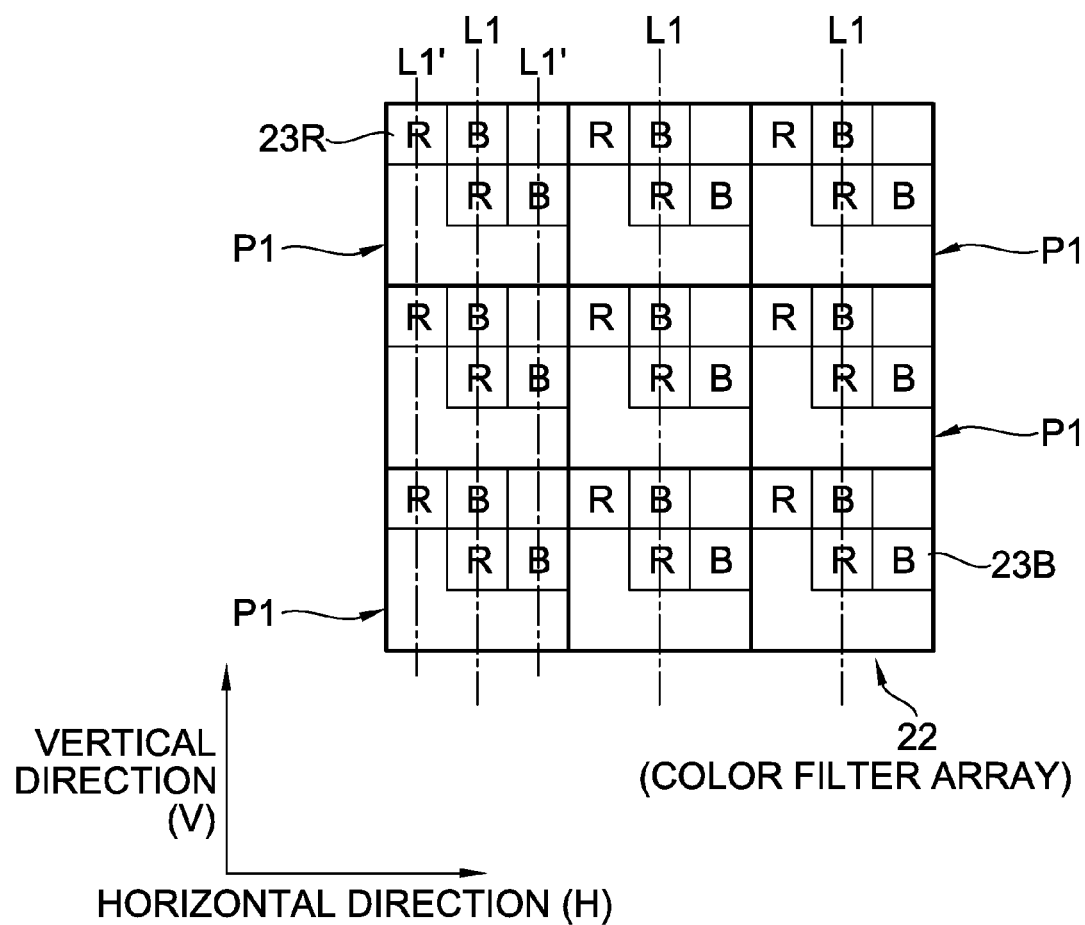
FIG. 5A is an explanatory diagram to describe features (5) and (6) of the color filter array.

As illustrated in FIG. 5A, the R filter 23R and the B filter 23B are mutually adjacent and disposed in the first and second RGB filter arrays 26 and 27 (see FIG. 4). Moreover, the disposition is performed while the respective positions of the RB filters 23R and 23B in the first RGB filter array 26 and the respective positions of the RB filters 23R and 23B in the second RGB filter array 26 are shifted by one pixel interval in the horizontal direction (H). Here, "pixel interval" denotes the pixel interval (pitch) from the central point of a reference pixel (one pixel) to the central point of an adjacent pixel. By this means, among three filter lines in the vertical direction (V) in the basic array pattern P1, both the R filter 23R and the B filter 23B are included in one filter line L1, and either the R filter 23R or the B filter 23B is included in the remaining filter lines L1' (feature (5)). As a result, in the color filter array 22, the filter line L1 in the vertical direction (V) is provided at regular intervals in the horizontal direction (H).

Figure 5B:
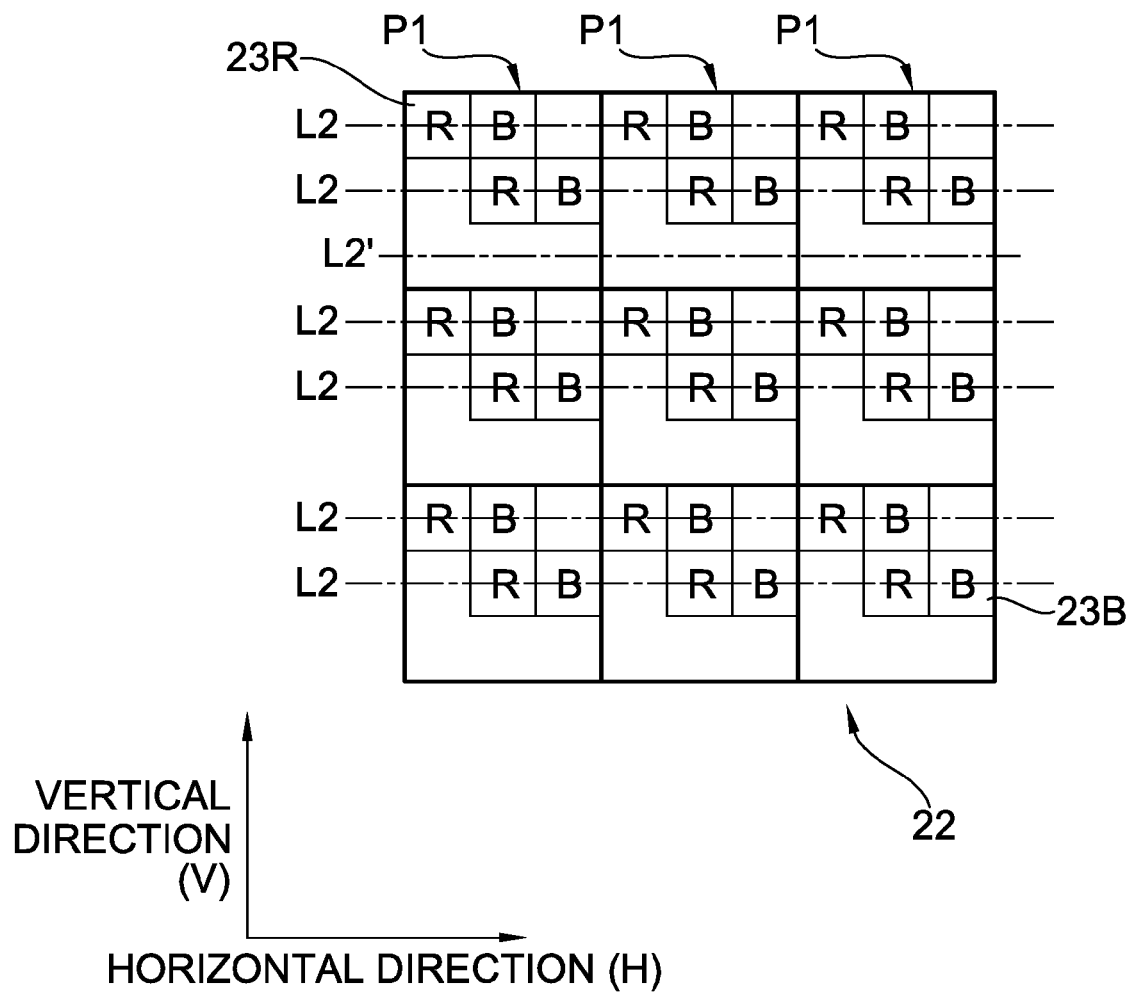
FIG. 5B is an explanatory diagram to describe features (5) and (6) of the color filter array.

As illustrated in FIG. 5B, among three filter lines in the horizontal direction (H) in the basic array pattern P1, both the R filter 23R and the B filter 23B are included in two filter lines L2 (first and second RGB filter arrays 26 and 27), and the R filter 23R and the B filter 23B are not included in the one remaining filter line L2' (feature (6)). As a result, in the color filter array 22, the filter line L2 in the horizontal direction (H) is provided at regular intervals in the vertical direction (V).

At this time, it is preferable to dispose each of the R filter 23R and the B filter 23B in each filter line in the horizontal direction (H) and vertical direction (V) of the color filter array 22 in the basic array pattern P1 in order to reduce the occurrence of color moire (false color). However, regarding a pixel (pixel value) corresponding to the R filter 23R or B filter 23B that is not disposed in the filter line L1', for example, it can be found by interpolation processing from a pixel corresponding to the R filter 23R or B filter 23B in the adjacent filter lines L1 and L1' by the use of a result of direction determination from an output signal value from the above-mentioned adjacent G pixel group (G pixels corresponding to the G filter group 29). Moreover, even regarding the pixel values (pixel values) of pixels corresponding to the RB filters 23R and 23B that are not disposed in the filter line L2', for example, they can be found by interpolation processing from pixels corresponding to the RB filters 23R and 23B in the adjacent filter line L2 by the use of a result of direction determination from the output signal value form the G pixel group.

Thus, even if the filter lines L1' and L2' are included in the color filter array 22, the occurrence of color moire (false color) is reduced in some degree. As a result, in a case where an optical low-pass filter (LPF) to suppress the occurrence of the false color is disposed in an optical path from the imaging optical system 10 to the imaging surface of the color imaging element 12, since the occurrence of the false color is reduced in some degree, it is possible to dispose an optical low-pass filter whose function to cut the high-frequency component is weak, or the optical low-pass filter may not be provided. By this means, it is possible to prevent resolution from deteriorating.

[Other Features]

Figure 6:
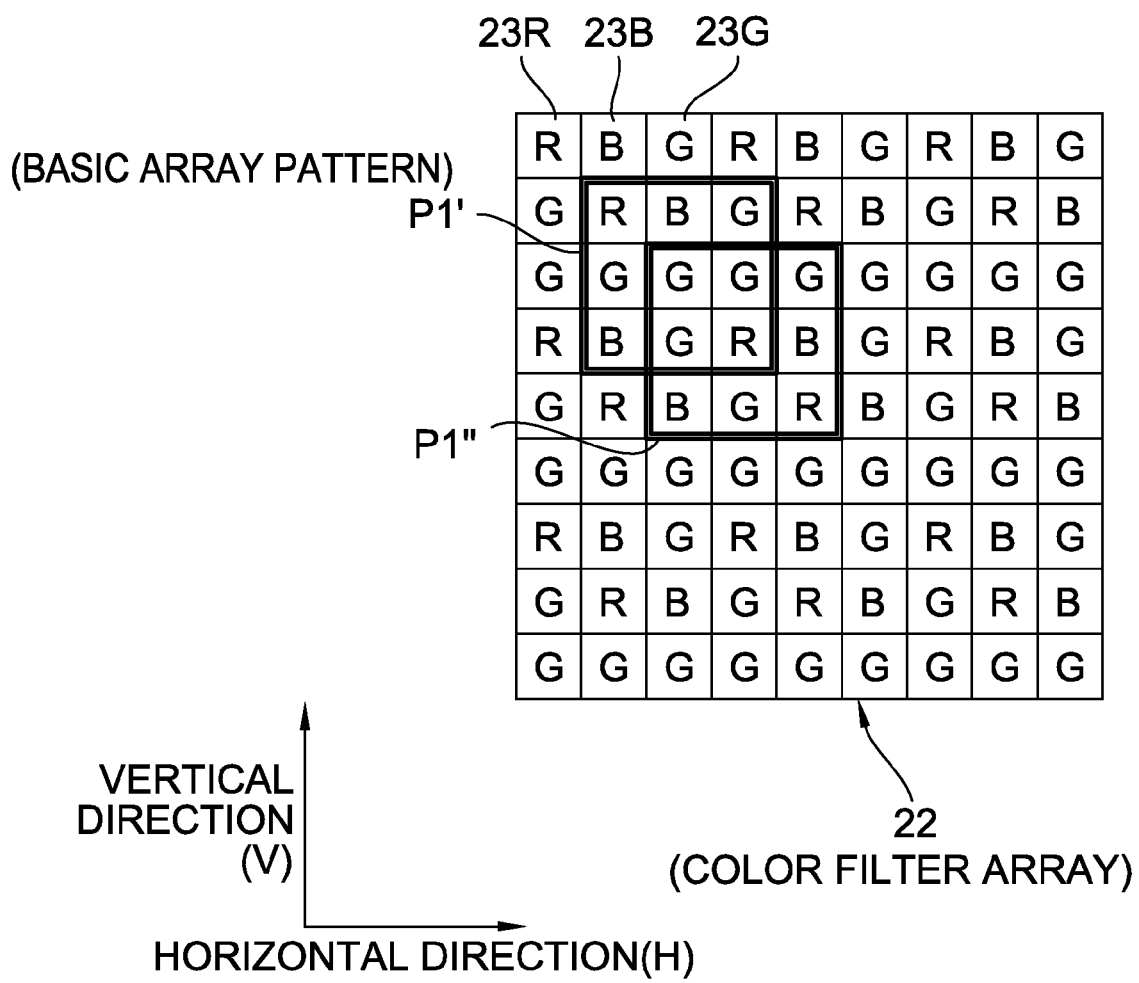
FIG. 6 is an explanatory diagram to describe multiple kinds of basic array patterns.

As illustrated in FIG. 6, when a basic array pattern shifting the basic array pattern P1 by one pixel in the horizontal direction (H) and the vertical direction (V) is assumed to be P1' and a basic array pattern shifting it by two pixels in the horizontal direction (H) and the vertical direction (V) is assumed to be P1", even if these basic array patterns P1' and P1" are repeatedly disposed in the horizontal direction (H) and the vertical direction (V), the same color filter array 22 is provided. Thus, there are multiple basic array patterns that can form the color filter array 22 illustrated in FIG. 3. In the first embodiment, the basic array pattern P1 illustrated in FIGS. 3 and 4 is referred to as "basic array pattern" for convenience sake.

Figure 7A:
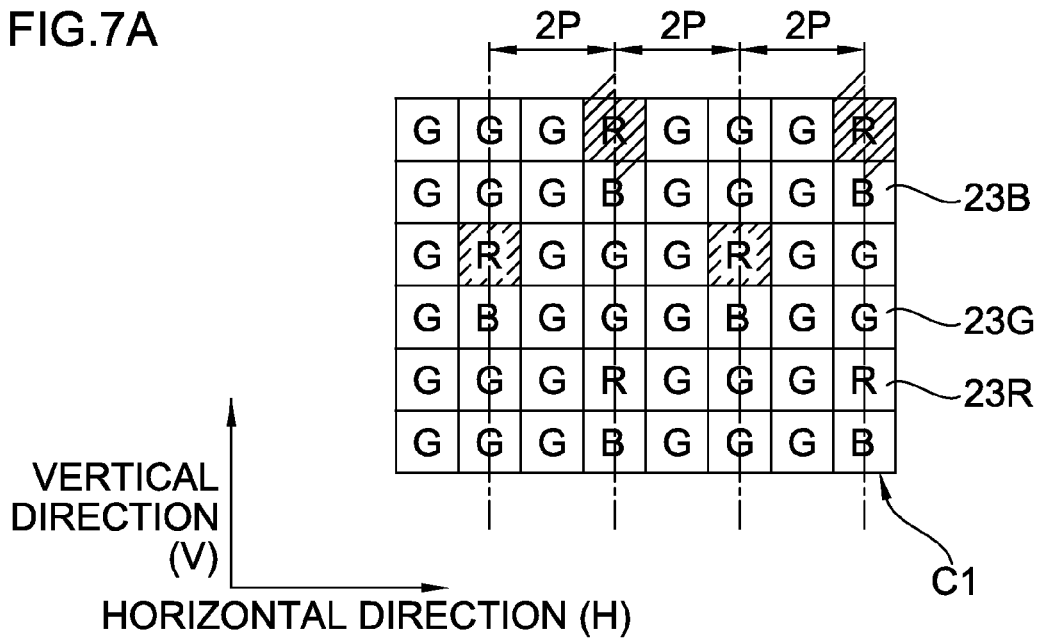
FIG. 7A is an explanatory diagram to describe a difference in the pixel intervals of R and B pixels between the present embodiment and a comparison example.
Figure 7B:
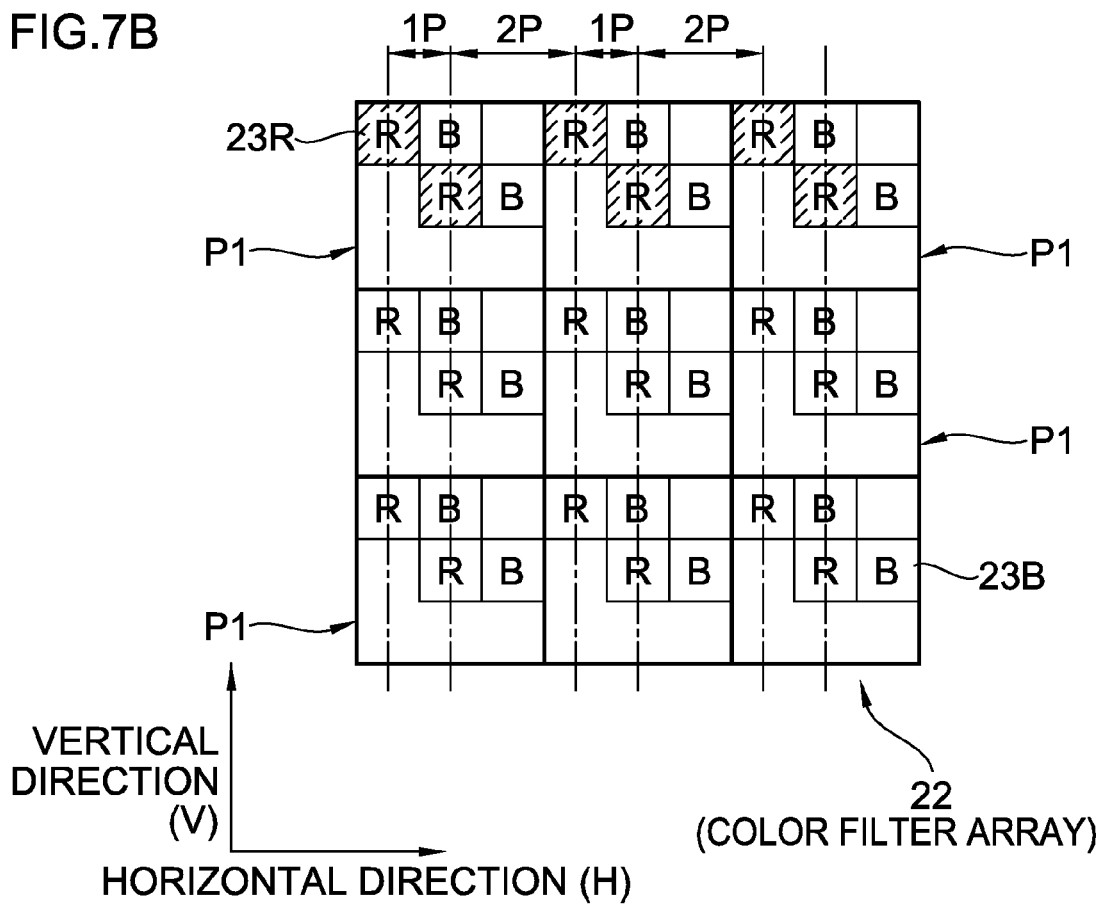
FIG. 7B is an explanatory diagram to describe a difference in the pixel intervals of R and B pixels between the present embodiment and a comparison example.

As described above, since the color filter array 22 of the present invention has features (1) to (6), it is possible to simplify demosaicing process in the subsequent stage, improve the reproduction precision of demosaicing process in a high-frequency area, suppress aliasing at the time of demosaicing process and improve the high-frequency reproducibility, and prevent the deterioration of resolution. Especially, in the present invention, it is defined such that the basic array pattern P1 forming the color filter array 22 is assumed to be an array pattern corresponding to 3×3 pixels and the color filter array 22 satisfies above-mentioned features (1) to (6). As the size of this basic array pattern P1 (that is, a repeating array pattern forming the color filter array 22) becomes smaller, it is possible to perform signal processing such as demosaicing more easily. Therefore, the color imaging element 12 of the present invention can simplify processing in the subsequent stage more than a case where the color imaging element or the like of above-mentioned PTL 4 in which a color filter array is formed with a repeating array pattern of a large size is used. Moreover, similarly, in above-mentioned PTL 4, in a case where the R pixel and the B pixel are seen from the first direction (horizontal direction) and the second direction (vertical direction) like a color filter array C1 illustrated in FIG. 7A, three pixels thereof (for example, R pixels subjected to hatching display) are disposed in six pixels (interval of six pixels). Therefore, since the pixel interval of the same color becomes a two-pixel interval (2 P), it is not possible to reproduce a high-frequency input of one pixel interval. By contrast with this, in a case where the R pixel and the B pixel are seen from the first direction (horizontal direction) and the second direction (vertical direction) in this example as illustrated in FIG. 7B, two pixels are disposed in three pixels (interval of three pixels), and the pixel interval of the same color becomes the repetition of one-pixel interval (1P) and two-pixel interval (2P). Therefore, it is possible to perform reproduction at higher quality as compared with a case where the color imaging element or the like of PTL 4 is used.

[Color Imaging Element of Second Embodiment]

Figure 8:
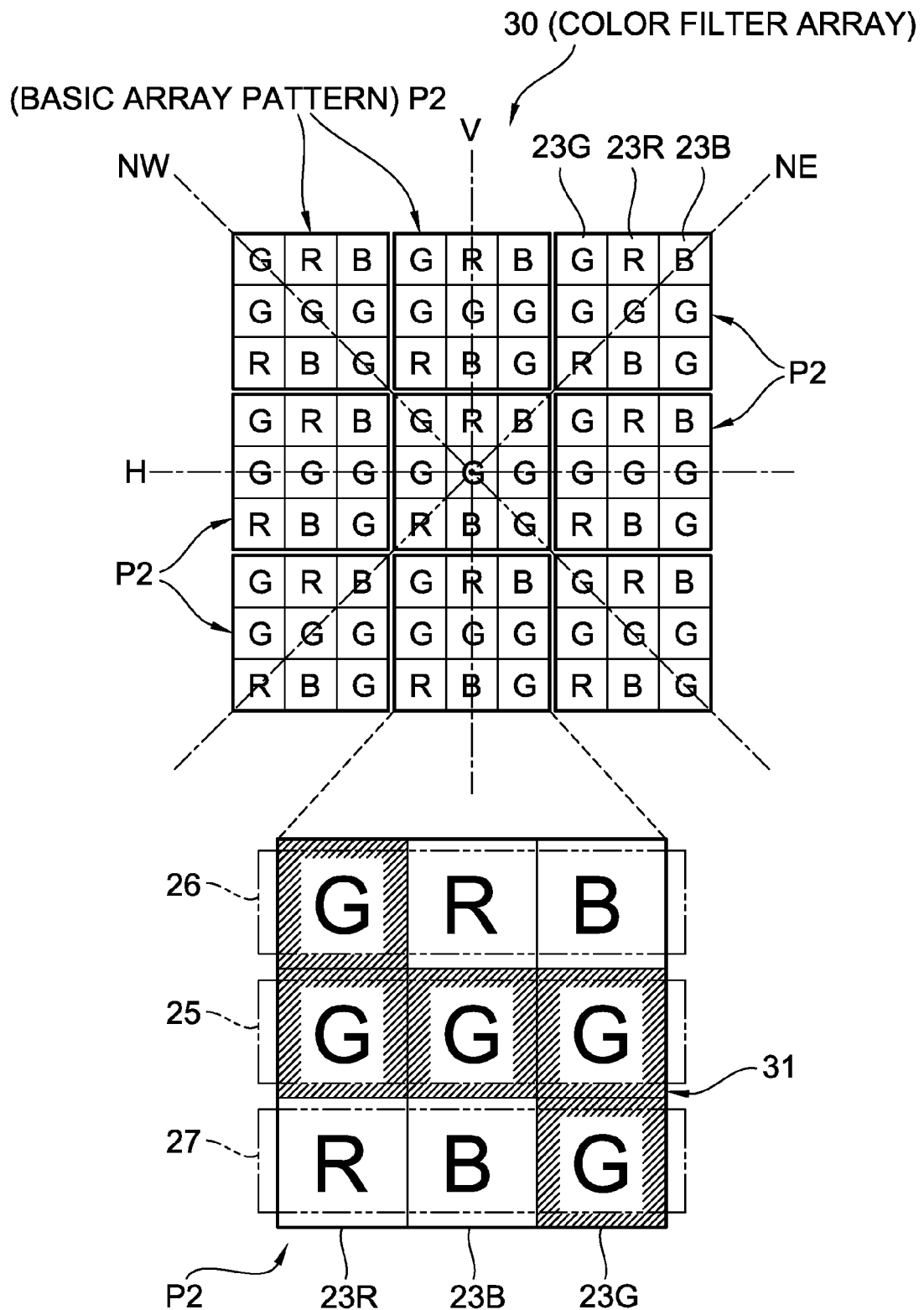
FIG. 8 is a front view of a color filter array of a second embodiment.

Next, a color imaging element of the second embodiment of the present invention is described using FIG. 8. Here, the color imaging element of the second embodiment has the basically the same configuration as the above-mentioned first embodiment except for that it includes a color filter array 30 having an array pattern different from the color filter array 22 of the above-mentioned first embodiment. Therefore, regarding what has the same function or configuration as that of the above-mentioned first embodiment, the same reference numeral is assigned and explanation thereof is omitted.

[Color Filter Array of Second Embodiment]

The color filter array 30 includes a basic array pattern P2 formed by arraying RGB filters 23R, 23G and 23B in an array pattern corresponding to 3×3 pixels, and this basic array pattern P2 is repeatedly disposed in the horizontal direction (H) and the vertical direction (V). Therefore, the color filter array 30 has above-mentioned feature (1).

Similarly to the basic array pattern P1 of the first embodiment, the basic array pattern P2 is formed with the above-mentioned filter arrays 25 to 27. However, in the basic array pattern P2, the G filter array 25 is disposed between the first RGB filter array 26 and the second RGB filter array 27.

Even in such the color filter array 30, one or more G filters 23G are disposed in each filter line in the horizontal (H), vertical (V) and oblique (NE, NW) directions. Moreover, the ratio of respective pixel numbers of RGB pixels in the basic array pattern P2 is 2:5:2. Therefore, the color filter array 30 has above-mentioned features (2) and (3).

The basic array pattern P2 includes a G filter group 31 (displayed by hatching in the figure) including each G filter 23G of the G filter array 25 and G filters 23G in the first and second RGB filter arrays 26 and 27 adjacent to this. By this means, similarly to the first embodiment, by calculating the difference absolute values of the pixel values of the G pixels in the horizontal and vertical directions (H, V), it is possible to determine a direction with the higher correlation out of these directions. Therefore, the color filter array 30 has above-mentioned feature (4).

Moreover, similarly to the first embodiment, since the basic array pattern P2 is formed with the G filter array 25 and the first and second RGB filter arrays 26 and 27, it has features (5) and (6) similar to the color filter array 22 of the first embodiment.

As described above, since even the color filter array 30 of the second embodiment has above-mentioned features (1) to (6) in the same way as the first embodiment, the effect similar to that of the color filter array 22 of the first embodiment is acquired.

[Other Modifications of Basic Array Pattern]

The array pattern of a color filter array (basic array pattern) can be arbitrarily changed within a range that satisfies above-mentioned features (2) to (6). For example, the color filter array may be configured with a basic array pattern P1a formed by rotating the basic array pattern P1 by 90° as illustrated in portions (A) and (B) of FIG. 9.

Figure 9:
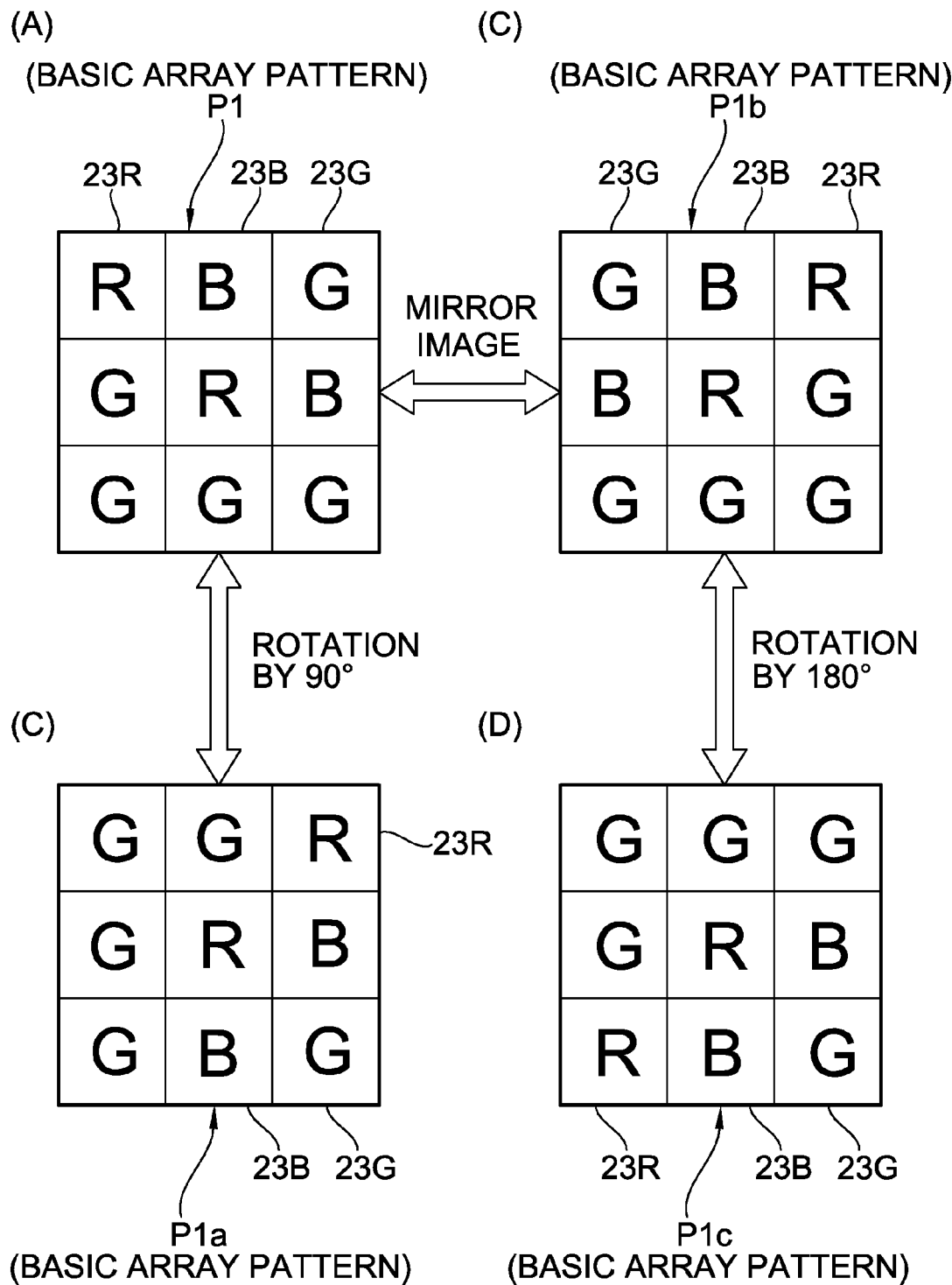
FIG. 9 is an explanatory diagram to describe a modification of a basic array pattern.

Moreover, as illustrated in portions (C) and (D) of FIG. 9, the color filter array may be configured with a basic array pattern P1b in which the disposition of RGB filters 23R, 23G and 23B has a mirror image relationship with the basic array pattern P1, or a basic array pattern P1c formed by rotating the basic array pattern P1b by 180°, and so on. In addition, the position relationship between the R filter 23R and the B filter 23B in each of the basic array patterns P1 and P1a to P1c may be reversed though the illustration is omitted. Moreover, each embodiment after a third embodiment described later is also similar.

<Condition of First Filter (First Color)>

In each above-mentioned embodiment, an explanation is given using an example of the G filter 23G of the G color as the first filter having the first color of the present invention, but the same effect can be acquired even by using a filter that satisfies any of following conditions (1) to (4) instead of the G filter 23G or instead of part of the G filter 23G.

[Condition (1)]

Condition (1) is that the contribution ratio to acquire a brightness signal is 50% or more. This contribution ratio 50% is a value defined to distinguish the first color (such as the G color) and the second color (such as the R and B colors) of the present invention, which is a value defined such that a color whose contribution ratio to acquire brightness data is relatively higher than the R color and the B color is included in the "first color". Since the contribution ratio of the G color becomes 60% as shown in above-mentioned equation (1), condition (1) is satisfied. Moreover, the contribution ratios of other colors than the G color can also be acquired by experiment or simulation. Therefore, a filter having a color whose contribution ratio is 50% or more excluding the G color can be used as the first filter of the present invention. Here, a color whose contribution ratio is less than 50% becomes the second color (such as the R color and the B color) of the present invention, and a filter having this color becomes the second filter of the present invention.

[Condition (2)]

Condition (2) is that the peak of the transmittance of a filter is within a wavelength range from equal to or greater than 480 nm to equal to or less than 570 nm. As for the transmittance of the filter, for example, a value measured by a spectrophotometer is used. This wavelength range is a range defined to distinguish the first color (such as the G color) and the second color (such as the R and B colors) of the present invention, which is a range defined such that the peak of the R color or B color whose contribution ratio mentioned above is relatively low is not included and the peak of the G color whose contribution ratio is relatively high is included. Therefore, a filter in which the peak of transmittance is within a wavelength range from equal to or greater than 480 nm to equal to or less than 570 nm can be used as the first filter. Here, a filter in which the peak of transmittance is outside the wavelength range from equal to or greater than 480 nm to equal to or less than 570 nm becomes the second filter (R filter 23R and B filter 23B) of the present invention.

[Condition (3)]

Condition (3) is that the transmittance within a wavelength range from equal to or greater than 500 nm to equal to or less than 560 nm is higher than the transmittance of the second filter (R filter 23R and B filter 23B). Even in this condition (3), as for the filter transmittance, for example, a value measured by a spectrophotometer is used. The wavelength range of this condition (3) is a range defined to distinguish the first color (such as the G color) and the second color (such as the R and B colors) of the present invention, and denotes a range in which the transmittance of a filter having a color whose contribution ratio mentioned above is relatively higher than the R color and the B color is higher than the transmittance of the RB filters 23R and 23B. Therefore, a filter in which the transmittance is relatively high within a wavelength range from equal to or greater than 500 nm to equal to or less than 560 nm can be used as the first filter, and a filter in which the transmittance is relatively low can be used as the second filter.

[Condition (4)]

Condition (4) is that filters of two or more colors including a color that most contributes to a brightness signal among three primary colors (for example, the G color of RGB) and a color different from these three primary colors can be used as the first filter. In this case, a filter corresponding to a color different from each color of the first filter becomes the second filter.

[Color Imaging Element of Third Embodiment]

Figure 10:
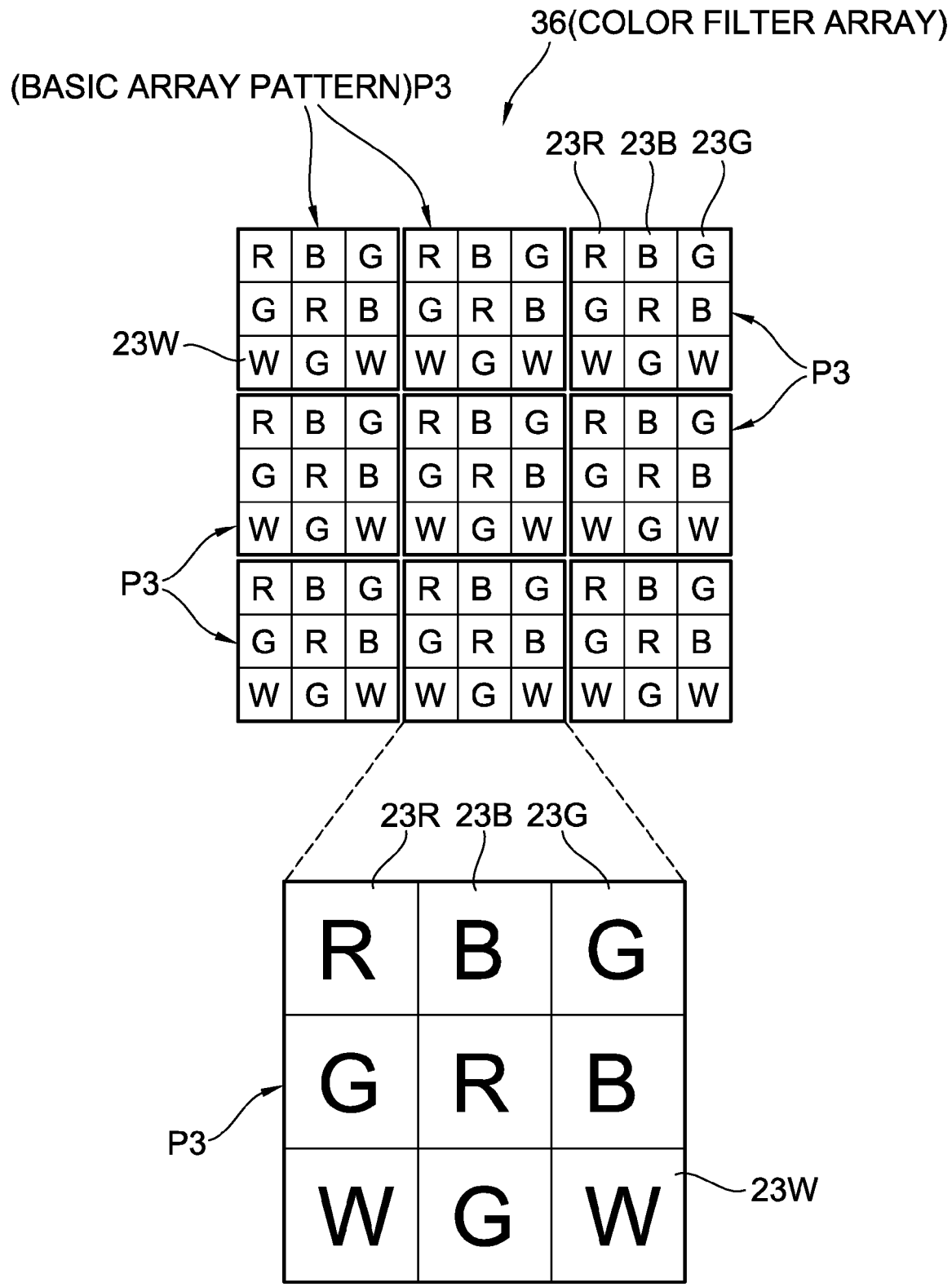
FIG. 10 is a front view of a color filter array of a third embodiment having a transparent filter.

Next, the color imaging element of the third embodiment of the present invention is described using FIG. 10. Here, the color imaging element of the third embodiment has basically the same configuration as the above-mentioned first embodiment except for that it includes a white pixel (which may be called a clear pixel) that receives white light (light of a wavelength region of visible light) besides RGB pixels. Therefore, regarding what has the same function or configuration as that of the above-mentioned first embodiment, the same reference numeral is assigned and explanation thereof is omitted.

[Color Filter Array of Third Embodiment]

The color imaging element of the third embodiment includes a color filter array 36 different from that of the first embodiment. The color filter array 36 includes a basic array pattern P3 in which the above-mentioned RGB filters 23R, 23G and 23B, and a transparent filter 23W (first filter) are arrayed in an array pattern corresponding to 3×3 pixels, and this basic array pattern P3 is repeatedly disposed in the horizontal and vertical directions (H, V). Therefore, the color filter array 36 has above-mentioned feature (1).

The basic array pattern P3 has an array pattern in which part of the G filters 23G of the basic array pattern P1 is replaced with the transparent filter 23W. For example, in the present embodiment, the G filter 23G located in both ends of the horizontal direction of the G filter array 25 is replaced with the transparent filter 23W. Thus, in the color imaging element of the third embodiment, part of the G pixels is replaced with a white pixel. By this means, it is possible to realize high sensitivity, and, even if the pixel size is miniaturized by leaving the G pixel, it is possible to suppress the degradation of color reproducibility.

The transparent filter 23W is a filter of a transparent color (first color). The transparent filter 23W can transmit light corresponding to the wavelength region of visible light, and, for example, denotes a filter in which the light transmittance of each color of RGB is 50% or more. Since the transmittance of the transparent filter 23W is higher than that of the G filter 23G, the contribution ratio to acquire a brightness signal is also higher than the G color (60%), and above-mentioned condition (1) is satisfied.

Figure 11:
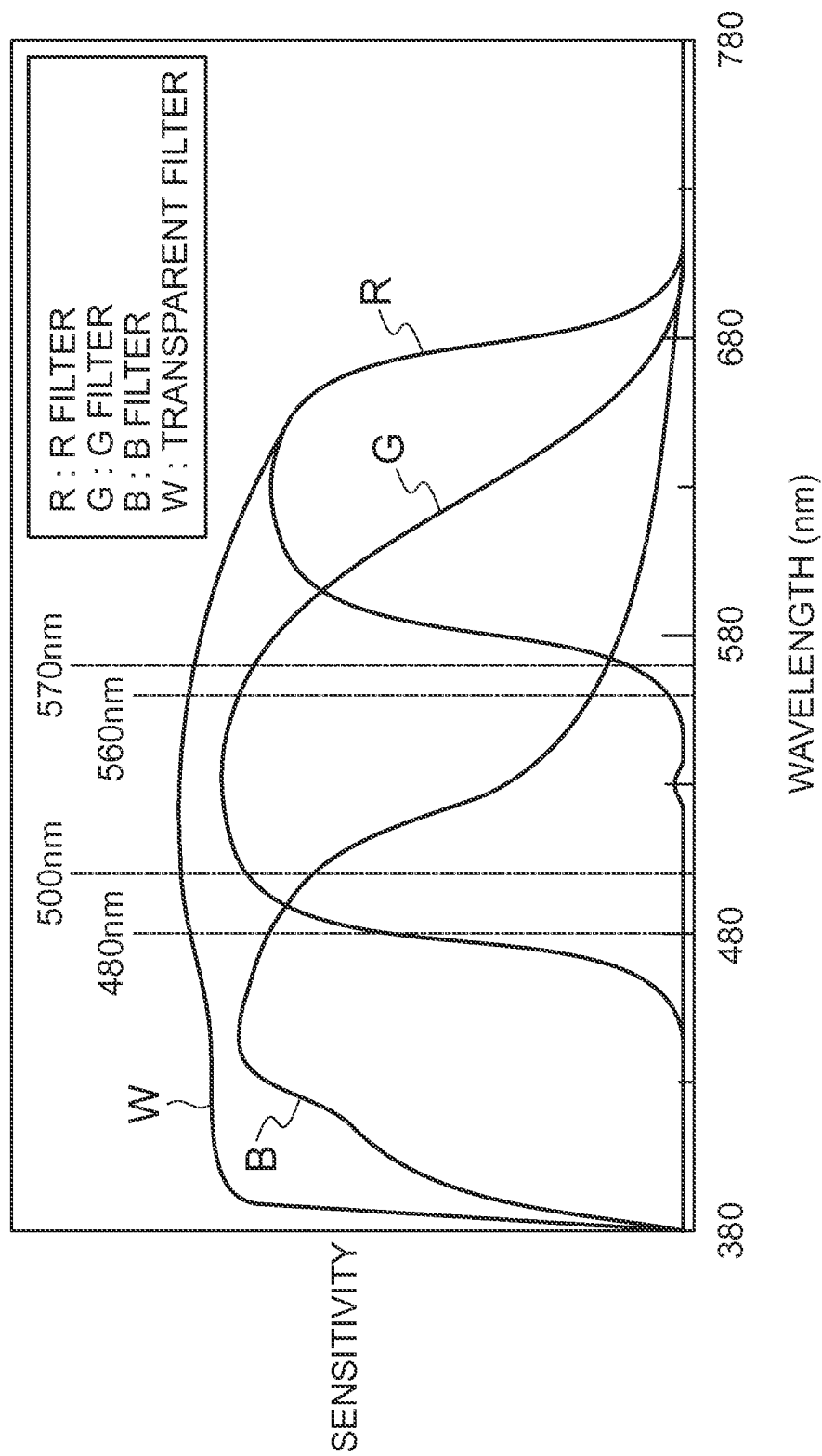
FIG. 11 is a graph illustrating the spectral sensitivity characteristic of the color filter array of the third embodiment.

In FIG. 11 that illustrates the spectral sensitivity characteristic of the color filter array 36, the transmittance peak of the transparent filter 23W (sensibility peak of the white pixel) is within a wavelength range from equal to or greater than 480 nm to equal to or less than 570 nm (from 480 nm or more to 570 nm or less). Moreover, the transmittance of the transparent filter 23W is higher than the transmittances of the RB filters 23R and 23B within a wavelength range from equal to or greater than 500 nm to equal to or less than 560 nm (from 500 nm or more to 560 nm or less). Therefore, the transparent filter 23W satisfies above-mentioned conditions (2) and (3). Here, similarly to the transparent filter 23W, even the G filter 23G satisfies above-mentioned conditions (1) to (3).

Thus, since the transparent filter 23W satisfies above-mentioned conditions (1) to (3), it is possible to use it as the first filter of the present invention. Here, in the color filter array 36, since part of the G filter 23G corresponding to the G color that most contributes to a brightness signal among three primary colors of RGB is replaced with the transparent filter 23W, above-mentioned condition (4) is satisfied.

Returning to FIG. 10, as described above, since the color filter array 36 is basically the same as the color filter array 22 of the first embodiment except for that part of the G filter 23G is replaced with the transparent filter 23W, it has features (2) to (6) similarly to the first embodiment. Therefore, it is possible to acquire the effect similar to the effect described in the first embodiment.

Here, the disposition and number of the transparent filters 23W are not limited to the embodiment illustrated in FIG. 10 and may be arbitrarily changed. In this case, if one or more first filters including the G filter 23G and the transparent filter 23W are included in the line of each direction of the horizontal direction (H), vertical direction (V) and oblique directions (NE, NW) of the color filter array 36, above-mentioned feature (2) is satisfied.

[Color Imaging Element of Fourth Embodiment]

Figure 12:
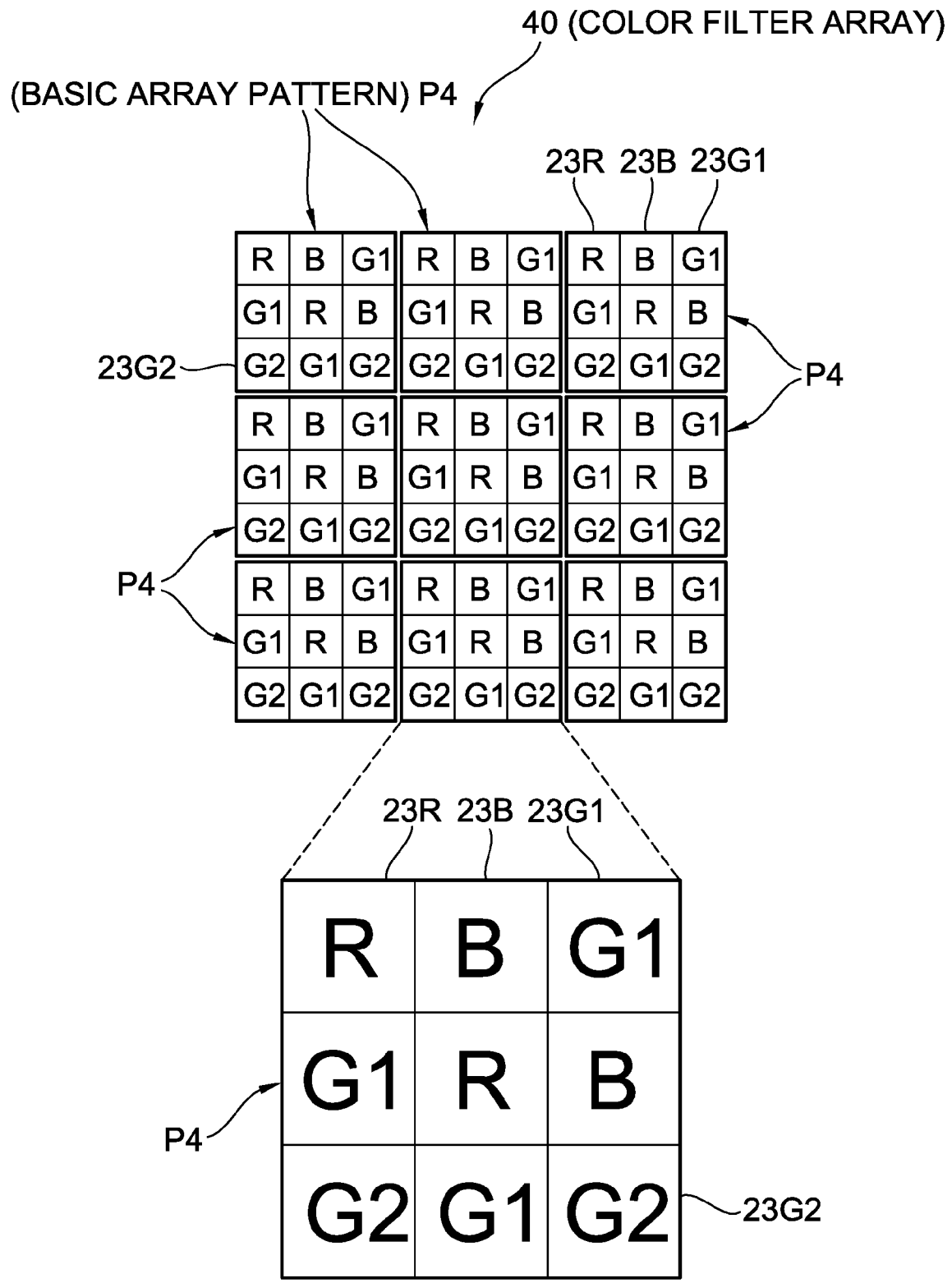
FIG. 12 is a front view of a color filter array of a fourth embodiment having two kinds of G filters.

Next, the color imaging element of the fourth embodiment of the present invention is described using FIG. 12. Here, the color imaging element of the fourth embodiment has basically the same configuration as that of above-mentioned first embodiment except for that it includes two kinds of G pixels. Therefore, regarding what has the same function or configuration as that of the above-mentioned first embodiment, the same reference numeral is assigned and explanation thereof is omitted.

[Color Filter Array of Fourth Embodiment]

The color imaging element of the fourth embodiment includes a color filter array 40 different from that of the first embodiment. The color filter array 40 includes a basic array pattern P4 in which the R filter 23R, a first G filter 23G1 and a second G filter 23G2 (first filter) and the B filter 23B are arrayed in an array pattern corresponding to 3×3 pixels, and this basic array pattern P4 is repeatedly disposed in the horizontal and vertical directions (H, V). Therefore, the color filter array 40 has above-mentioned feature (1).

The basic array pattern P4 has an array pattern in which each G filter 23G of the basic array pattern P1 of the first embodiment is replaced with the first G filter 23G1 or the second G filter 23G2. For example, in the present embodiment, the G filter 23G located in both ends of the horizontal direction of the G filter array 25 is replaced with the second G filter 23G2 and the G filter 23G located in the center of the horizontal direction is replaced with the first G filter 23G1. Moreover, the G filters 23G of the first and second RGB filter arrays 26 and 27 are replaced with the first G filter 23G1.

Figure 13:
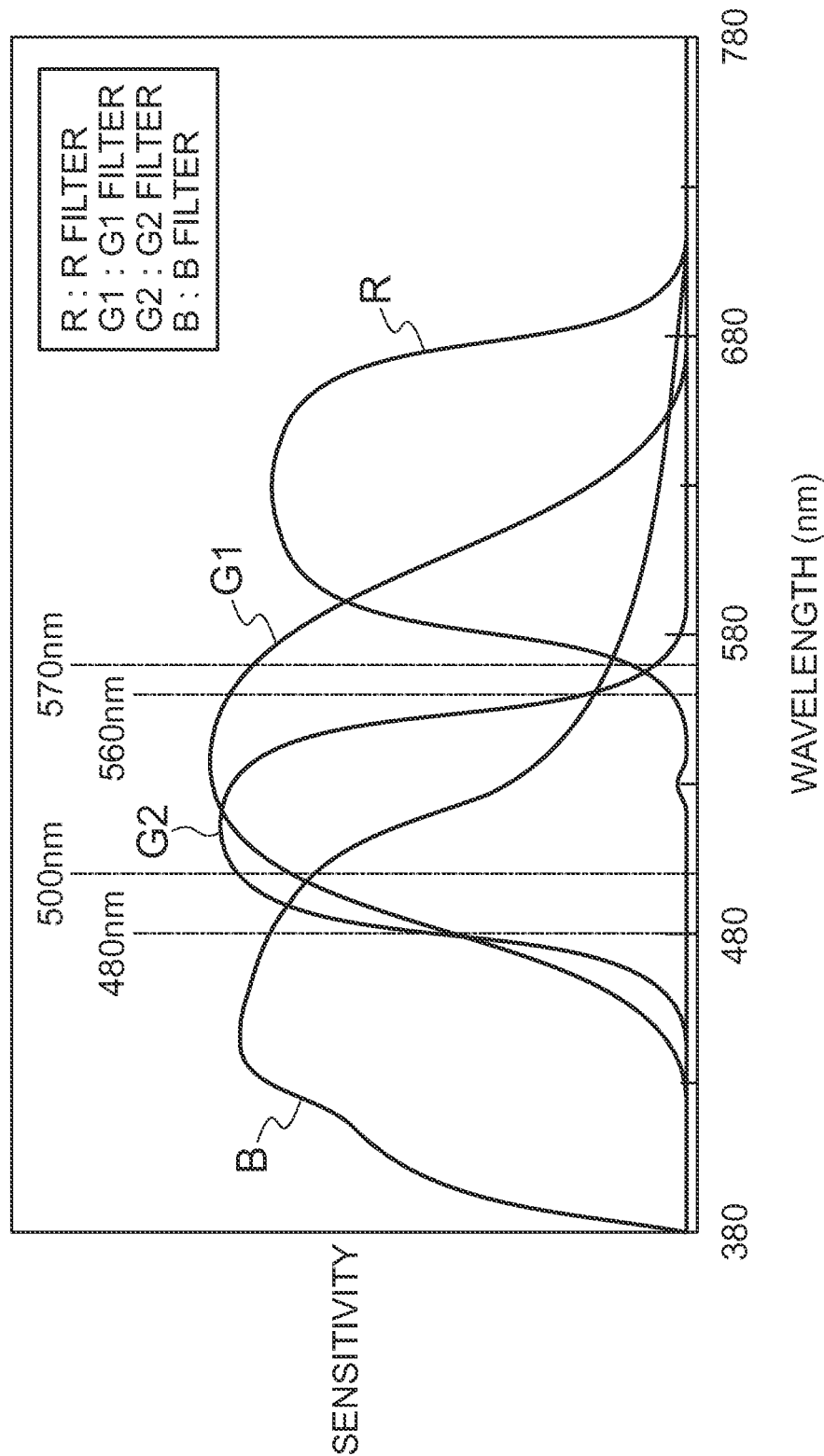
FIG. 13 is a graph illustrating the spectral sensitivity characteristic of the color filter array of the fourth embodiment.

The first G filter 23G1 transmits the G light of the first wavelength band, and the second G filter 23G2 transmits the G light of the second wavelength band having high correlation with the first G filter 23G1 (see FIG. 13). As the first G filter 23G1, it is possible to use an existing G filter (for example, G filter 23G of the first embodiment). Moreover, as the second G filter 23G2, it is possible to use a filter having high correlation with the first G filter 23G1. In this case, it is desirable that, for example, the peak value of the spectral sensitivity curve of the second G filter 23G2 is in a wavelength range from 500 nm to 535 nm (near the peak value of the spectral sensitivity curve of the existing G filter). Here, as a method of deciding color filters of four colors, for example, the method described in Japanese Patent Application Laid-Open No. 2003-284084 is used.

Thus, by assuming image colors acquired by the color imaging element of the fourth embodiment to be four kinds and adding acquired color information, it is possible to express colors more accurately as compared with a case where only three kinds of colors (RGB) are acquired. That is, a color seen as the different one by the eyes can be reproduced as the different color, and a color seen as the same one by the eyes can be reproduced as the same color (improve "discrimination of colors").

Since the transmittances of the first and second G filters 23G1 and 23G2 are basically the same as the transmittance of the G filter 23G of the first embodiment, the contribution ratio to acquire a brightness signal becomes higher than 50%. Therefore, the first and second G filters 23G1 and 23G2 satisfy above-mentioned condition (1).

Moreover, in FIG. 13 that illustrates the spectral sensitivity characteristic of the color filter array 40, the transmittance peak of each of the G filters 23G1 and 23G2 (sensibility peak of each G pixel) is within a wavelength range from equal to or greater than 480 nm to equal to or less than 570 nm. The transmittance of each of the G filters 23G1 and 23G2 becomes higher than the transmittances of the RB filters 23R and 23B within a wavelength range from equal to or greater than 500 nm to equal to or less than 560 nm. Therefore, each of the G filters 23G1 and 23G2 satisfies above-mentioned conditions (2) and (3) too.

Returning back to FIG. 12, since the color filter array 40 is basically the same as the color filter array 22 of the first embodiment except for that it includes each of the G filters 23G1 and 23G2, it has above-mentioned features (2) to (6) similarly to the first embodiment. Therefore, it is possible to acquire the effect similar to the effect described in the first embodiment.

Here, the disposition and number of G filters 23G1 and 23G2 are not limited to the embodiment illustrated in FIG. 12 and may be arbitrarily changed. Moreover, the G filter kind may be increased to three kinds or more.

[Color Imaging Element of Fifth Embodiment]

Figure 14:
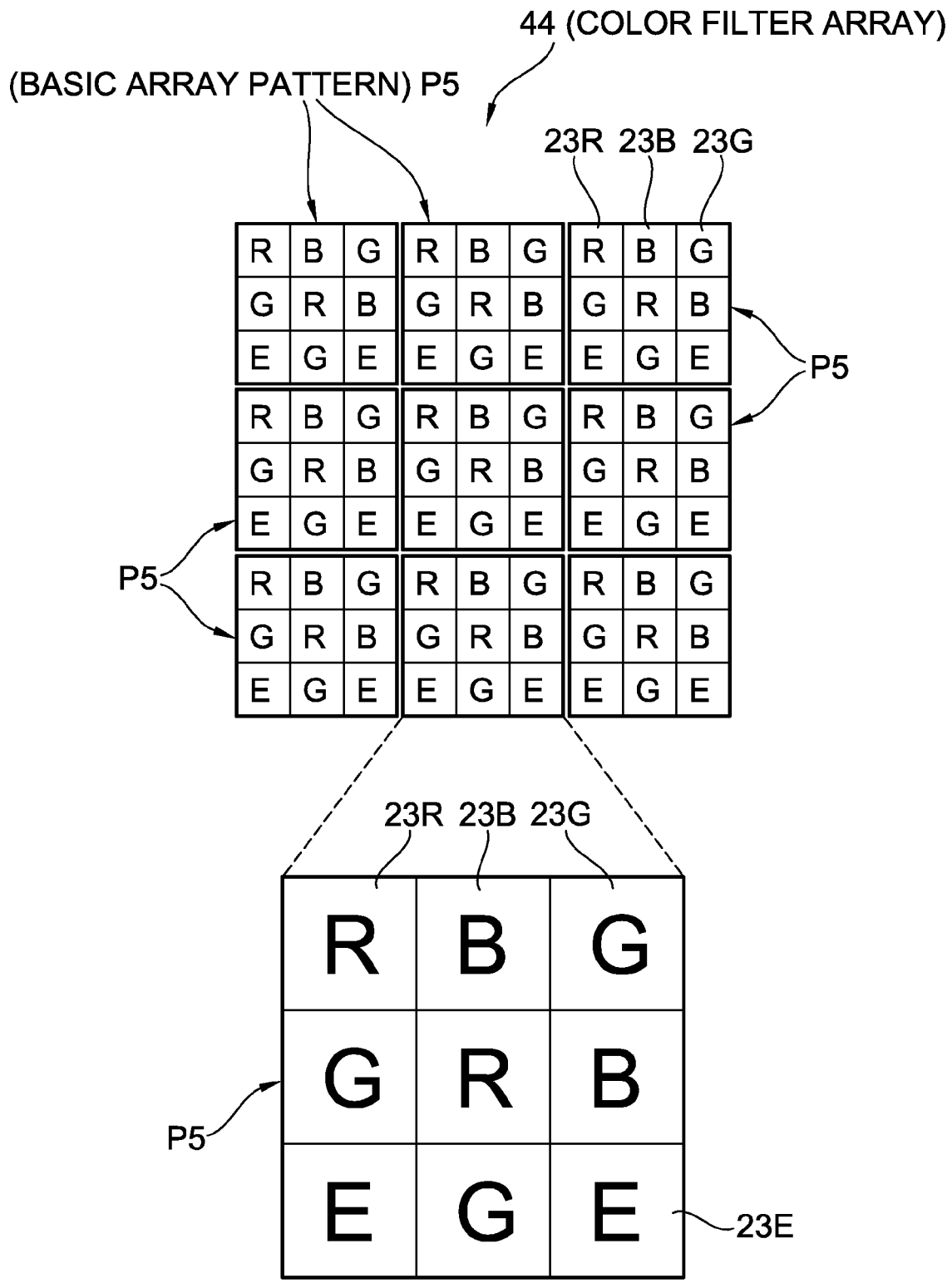
FIG. 14 is a front view of a color filter array of a fifth embodiment having an emerald (E) filter.

Next, the color imaging element of the fifth embodiment of the present invention is described using FIG. 14. Here, the color imaging element of the fifth embodiment has basically the same configuration as that of the above-mentioned first embodiment except for that it includes the E pixel that receives light of the emerald (E) color corresponding to the fourth color of the present invention besides RGB pixels. Therefore, regarding what has the same function or configuration as that of the above-mentioned first embodiment, the same reference numeral is assigned and explanation thereof is omitted.

[Color Filter Array of Fifth Embodiment]

The color imaging element of the fifth embodiment includes a color filter array 44 different from that of the first embodiment. The color filter array 44 includes a basic array pattern P5 in which the above-mentioned RGB filters 23R, 23G and 23B and an E filter 23E (first filter) are arrayed in an array pattern corresponding to 3×3 pixels, and this basic array pattern P5 is repeatedly disposed in the horizontal and vertical directions (H, V). Therefore, the color filter array 44 has above-mentioned feature (1).

The basic array pattern P5 has an array pattern in which the transparent filter 23W of the basic array pattern P3 of the third embodiment illustrated in FIG. 10 is replaced with the E filter 23E. Thus, by using the color filter array 44 of four colors in which part of the G filter 23G is replaced with the E filter 23E, it is possible to improve the reproduction of the high-frequency component of brightness, reduce the jagginess and improve the resolution feeling.

Figure 15:
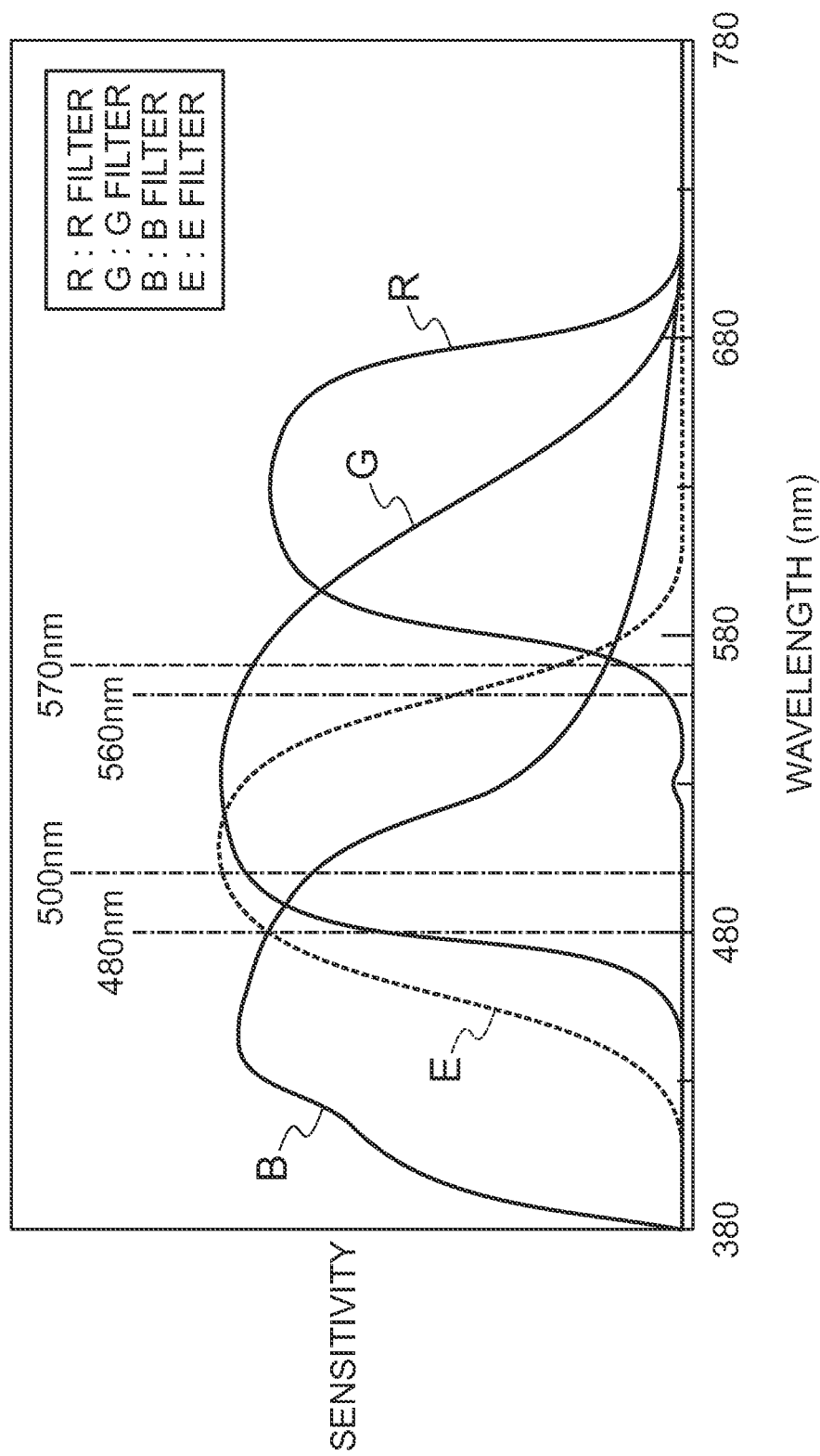
FIG. 15 is a graph illustrating the spectral sensitivity characteristic of the color filter array of the fifth embodiment.

In FIG. 15 that illustrates the spectral sensitivity characteristic of the color filter array 44, the transmittance peak of the E filter 23E (sensibility peak of the E pixel) is within a wavelength range from equal to or greater than 480 nm to equal to or less than 570 nm. Moreover, the transmittance of the E filter 23E becomes higher than the transmittances of the RB filters 23R and 23B within a wavelength range from equal to or greater than 500 nm to equal to or less than 560 nm. Therefore, the E filter 23E satisfies above-mentioned conditions (2) and (3). Moreover, in the color filter array 44, since part of the G filter 23G corresponding to the G color that most contributes to a brightness signal among three primary colors of RGB is replaced with the E filter 23E, it satisfies above-mentioned condition (4).

Here, the spectral characteristic illustrated in FIG. 15 has a peak on the shorter wavelength side than the G filter 23G, but there may be a case where it has the peak on the longer wavelength side than the G filter 23G (it is seen as a color slightly close to yellow). Thus, as the E filter 23E, it is possible to arbitrarily select the one that satisfies each condition of the present invention, and, for example, it is also possible to select the E filter 23E that satisfies condition (1).

Returning to FIG. 14, as described above, since the color filter array 44 is basically the same as the color filter array 22 of the first embodiment except for that part of the G filter 23G is replaced with the E filter 23E, it has features (2) to (6) similarly to the first embodiment. Therefore, it is possible to acquire the effect similar to the effect described in the first embodiment.

Here, the disposition and number of E filters 23E may be changed to the disposition and number different from those of the embodiment illustrated in FIG. 14. In this case, if one or more first filters including the G filter 23G and the E filter 23E are included in the line of each direction of the horizontal direction (H), vertical direction (V) and oblique directions (NE, NW) of the color filter array 44, above-mentioned feature (2) is satisfied.

Moreover, the E filter 23E is used as the first filter of the present invention in the above-mentioned fifth embodiment, but, for example, there is the one that does not satisfy above-mentioned conditions (1) to (4) among E filters 23E. Therefore, such an E filter 23E may be used as the second filter of the present invention.

[Color Imaging Element of Sixth Embodiment (Color Filter Array)]

Figure 16:
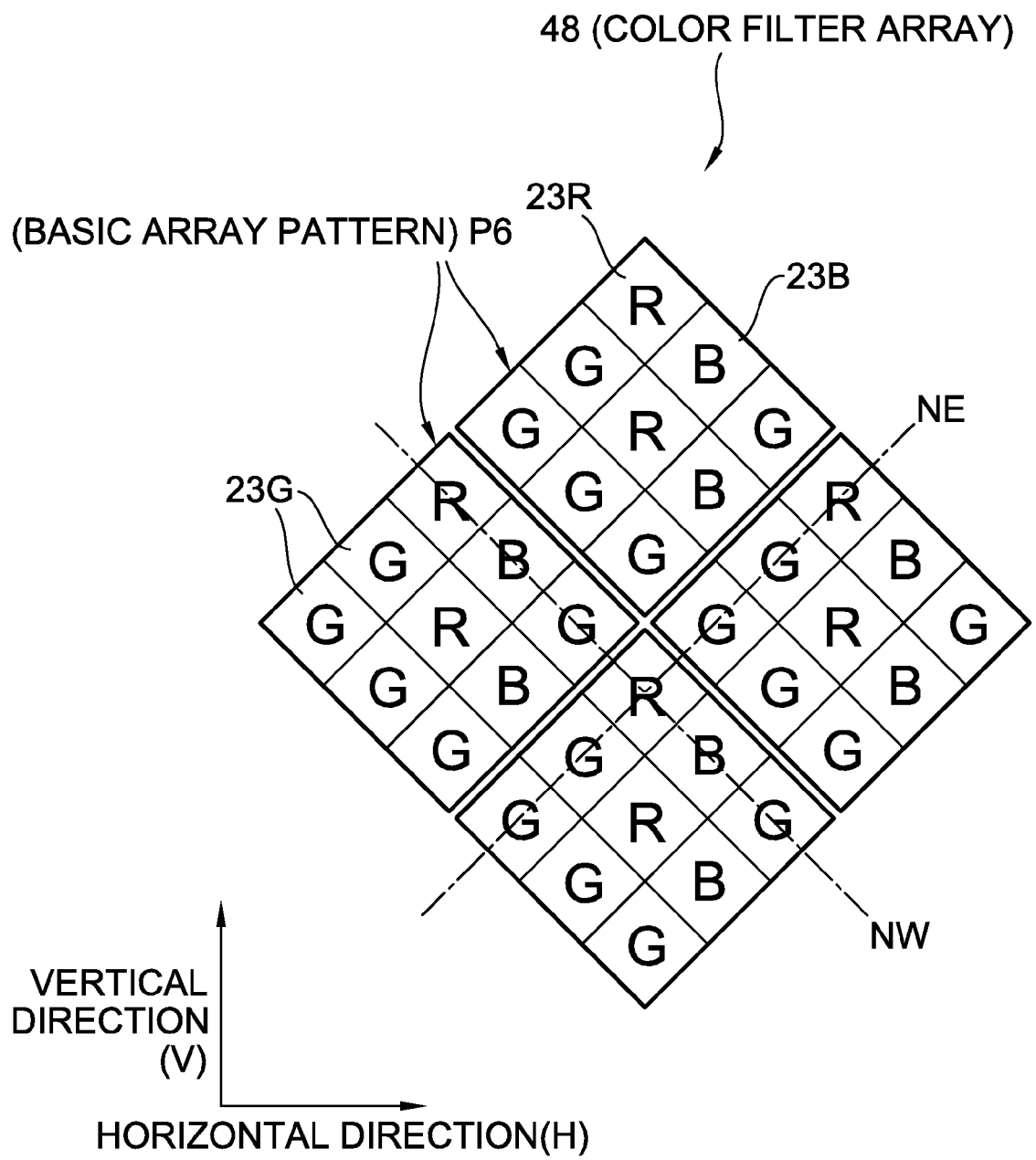
FIG. 16 is a front view of a color filter array of another embodiment with a color filter array as a honeycomb array.

Next, the color imaging element of the sixth embodiment of the present invention is described using FIG. 16. The color imaging element of this sixth embodiment has basically the same configuration as the color imaging element of the above-mentioned first embodiment except for that RGB pixels are two-dimensionally arrayed in the oblique directions (NE, NW). Therefore, regarding what has the same function or configuration as that the above-mentioned first embodiment, the same reference numeral is assigned and explanation thereof is omitted.

A color filter array 48 of the color imaging element of the sixth embodiment may be an array pattern which includes a basic array pattern P6 of a so-called honeycomb array shape formed by two-dimensionally arraying the RGB filters 23R, 23G and 23B in the oblique directions (NE, NW) and which is formed by repeatedly disposing the basic array pattern P6 in the oblique directions (NE, NW). In this case, the oblique directions (NE, NW) become the first and second directions of the present invention, and the horizontal and vertical directions (H, V) become the third and fourth directions of the present invention.

Since such the color filter array 48 is an array pattern in which the color filter array 22 of the first embodiment is rotated by 45° around the optical axis of the imaging optical system 10, it has features (1) to (6) similarly to the above-mentioned first embodiment. Here, even regarding basic array patterns P2 to P8 of the other embodiments (basic array patterns P7 and P8 are described later), the honeycomb array may be similarly applied though the illustration is omitted.

[Color Imaging Element of Seventh Embodiment (Color Filter Array)]

Figure 17:
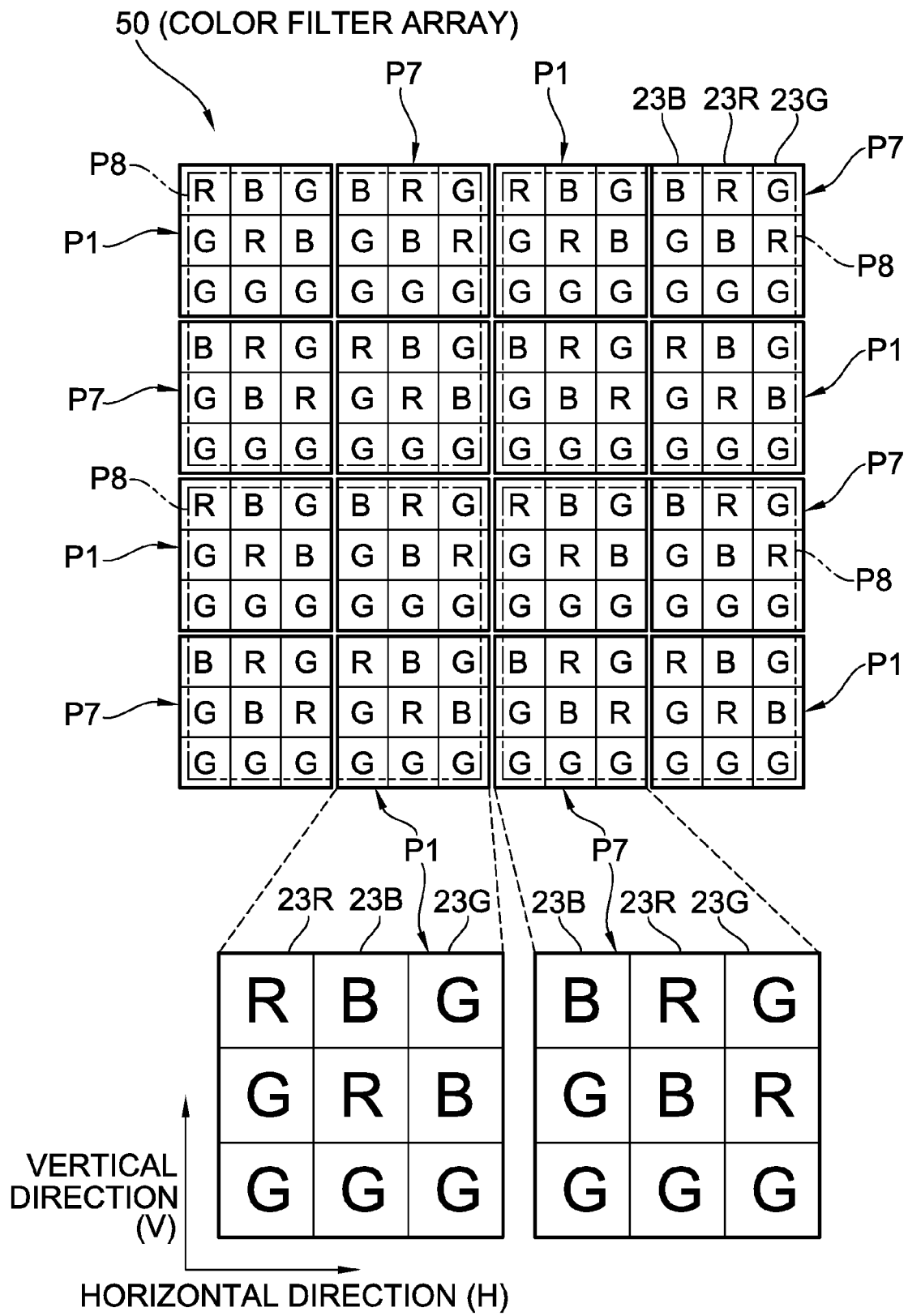
FIG. 17 is a front view of a color filter array of a seventh embodiment having two kinds of basic array patterns.

Next, the color imaging element of the seventh embodiment of the present invention is described using FIG. 17. The color imaging element 12 of the above-mentioned first embodiment has the color filter array 22 formed by repeatedly disposing the same basic array pattern P1 in the horizontal and vertical directions (H, V), but the color imaging element of the seventh embodiment has a color filter array 50 configured with two kinds of basic array patterns.

The color filter array 50 includes two kinds of basic array patterns P1 and P7 formed by arraying the RGB filters 23R, 23G and 23B in an array pattern corresponding to 3×3 pixels, and both the basic both array patterns P1 and P7 are disposed in the horizontal and vertical directions (H, V) alternately and repeatedly. The basic array pattern P7 has the same array pattern as the basic array pattern P1 except for that the position relationship of the RB filter 23R and 23B is reversed.

Two kinds of basic array patterns P1 and P7 are disposed in the horizontal and vertical directions (H, V) mutually and adjacently in the color filter array 50. Therefore, it can be understood that in the color filter array 50 has a configuration in which the basic array pattern P8 formed with 2×2 basic array patterns P1 and P7 is repeatedly disposed in the horizontal and vertical directions (H, V). Therefore, the color filter array 50 satisfies above-mentioned feature (1).

At this time, since the basic array pattern P8 is an array pattern corresponding to 6×6 pixels but is formed with two kinds of basic array patterns P1 and P7, it is possible to perform processing according to repeating patterns respectively corresponding to the basic array patterns P1 and P7 when demosaicing processing or the like is performed on R, G and B signals. As a result, even if the size of the basic array pattern P8 becomes large, it is possible to reduce the circuit scale of a processing circuit in the subsequent stage as compared with a random array in the related art and simplify processing in the subsequent stage.

Since the disposition of the G filter 23G of the basic array patterns P1 and P7 is identical, the G filter 23G is disposed in each filter line in the horizontal (H), vertical (V) and oblique directions (NE, NW) of the color filter array 50. As a result, the color filter array 50 has above-mentioned feature (2).

Moreover, the ratio of the pixel numbers of RGB pixels in each of the basic array patterns P1, P7 and P8 is 2:5:2, and the above-mentioned G filter group 29 (see FIG. 4) is included in each of the basic array patterns P1 and P7. In addition, the basic array pattern P7 is the same array pattern as the basic array pattern P1 except for that the disposition of the RB filters 23R and 23B is reversed. Therefore, the color filter array 50 has above-mentioned features (3), (4) and (6).

[Feature (5')]

Since the basic array pattern P1 and the basic array pattern P7 are basically the same array pattern except for that the disposition of the RB filters 23R and 23B is reversed, one or more R filters 23R and one or more B filters 23B are included in each filter line in the vertical direction (V) of the basic array pattern P8 (color filter array 50) formed with both basic array patterns P1 and P7 (feature (5')). As described above, it is preferable that each of the RB filters 23R and 23B is disposed in each filter line in the horizontal and vertical directions (H, V) in the basic array pattern to reduce the occurrence of color moire (false color). Therefore, by using the color filter array 50 formed with the basic array pattern P8, it is possible to suppress the occurrence of color moire (false color) more than the first embodiment and dispose an optical low-pass filter whose function to cut the high frequency component is weaker. By this means, it is possible to prevent resolution from deteriorating. Alternatively, since the occurrence of color moire (false color) is reduced in some degree, the optical low-pass filter may not be disposed.

As described above, since the color filter array 50 of the present invention has feature (5') in addition to above-mentioned features (1) to (4) and (6), it is possible to simplify demosaicing processing in the subsequent stage, improve the reproduction precision of demosaicing processing in a high-frequency area, suppress the aliasing at the time of demosaicing processing and improve the high-frequency reproducibility, realize higher resolution, improve the accuracy of demosaicing processing of RB pixels and determine a direction with higher correlation.

[Color Filter Array of Eighth Embodiment]

Figure 18:
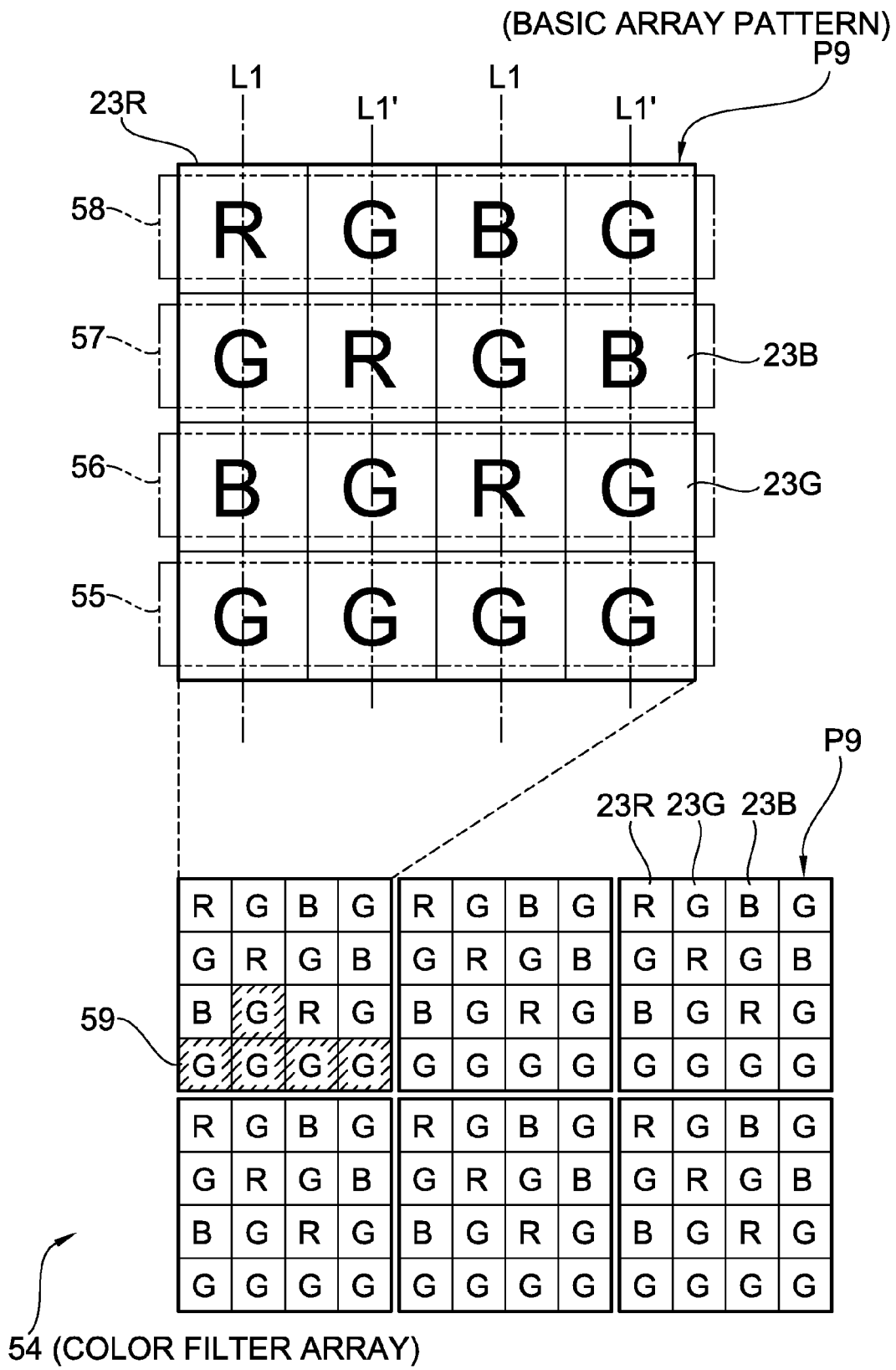
FIG. 18 is a front view of a color filter array of an eighth embodiment having a basic array pattern arrayed in an array pattern corresponding to 4×4 pixels.

Next, a color filter array 54 of the color imaging element of the eighth embodiment of the present invention is described using FIG. 18. The basic array patterns P1 to P7 forming the color filter array of each above-mentioned embodiment are array patterns corresponding to 3×3 pixels, but the color filter array 54 is formed with a basic array pattern P9 arrayed according to 4×4 pixels. Here, even the color imaging element of the eighth embodiment has basically the same configuration as the above-mentioned first embodiment except for that it includes the color filter array 54 different from the above-mentioned first embodiment. Therefore, regarding what has the same function or configuration as that of the above-mentioned first embodiment, the same reference numeral is assigned and explanation thereof is omitted.

The color filter array 54 includes the basic array pattern P9 formed by arraying the RGB filters 23R, 23G and 23B in an array pattern corresponding to 4×4 pixels, and this basic array pattern P9 is repeatedly disposed in the horizontal direction (H) and the vertical direction (V). Therefore, the color filter array 54 has above-mentioned feature (1).

The basic array pattern P9 includes a G filter array 55, a first RGB filter array 56, a second RGB filter array 57 and a third RGB filter array 58, and respective filter arrays 55 to 58 are arrayed in the vertical direction. The G filter array 55 (first filter array) is formed by arraying four G filters 23G in the horizontal direction (H). Respective RUB filter arrays 56 to 58 (second filter array) are formed by arraying two G filters 23G, one R filter 23R and one B filter 23B in the horizontal direction. By this means, the color filter array 54 has above-mentioned feature (6).

The disposition of the G filter 23G in respective filter arrays 55 to 58 is adjusted such that one or more G filters 23G are disposed in each filter line in the horizontal (H), vertical (V) and oblique (NE, NW) directions of the color filter array 54. By this means, the color filter array 54 has above-mentioned feature (2). Moreover, since the ratio of respective pixels of RGB pixels in the basic array pattern P9 becomes 3:10:3, the color filter array 54 has above-mentioned feature (3).

The basic array pattern P9 includes a G filter group 59 including each G filter 23G of the G filter array 55 and the G filter 23G in the first RGB filter array 56 adjacent to this. By this means, similarly to the first embodiment, it is possible to determine a direction with high correction out of respective directions of the horizontal and vertical directions (H, V). Therefore, the color filter array 54 has above-mentioned feature (4).

[Feature (5")]

In the respective RGB filter arrays 56 to 58, the G filter 23G is disposed between the R filter 23R and the B filter 23B. Moreover, in the respective RGB filter arrays 56 to 58, the positions of the RB filters 23R and 23B are shifted every line and disposed, and the position of the B filter 23B is shifted every line and disposed. That is, two or more R filters 23R of the same color and two or more B filters 23B of the same color are not disposed along a filter line in the vertical direction (V). By this means, both the R filter 23R and the B filter 23B are included in two filter lines LI among four filter lines in the vertical directions (V) in the basic array pattern P1, and any one of the R filter 23R and the B filter 23B is included in two remaining filter lines L1' (feature (5")).

Thus, in the basic array pattern P9, the ratio of the filter line L1 including each of the RB filters 23R and 23B becomes larger than that of the basic array pattern P1 of the first embodiment. Therefore, by using the color filter array 54 formed with the basic array pattern P9, it is possible to suppress the occurrence of color moire (false color) more than the color filter array 22 of the first embodiment. As a result, an optical low-pass filter whose function to cut the high frequency component is weaker can be disposed, or the optical low-pass filter may not be disposed.

As described above, since the color filter array 54 of the present invention has feature (5") in addition to above-mentioned features (1) to (4) and (6), it is possible to simplify demosaicing processing in the subsequent stage, improve the reproduction precision of demosaicing processing in a high-frequency area, suppress the aliasing at the time of demosaicing processing and improve the high-frequency reproducibility, realize high resolution, improve the accuracy of demosaicing processing of RB pixels and determine a direction with high correlation.

Moreover, since the basic array pattern P9 of the size corresponding to 4×4 pixels has a larger size than the basic array pattern P1 of the first embodiment but has a smaller size than the repeating array pattern of above-mentioned PTL 4, it is possible to further simplify processing in the subsequent stage as compared with a case where the color imaging element or the like of PTL 4 is used. In addition, when the R pixel and the B pixel are seen from the first direction (horizontal direction) and the second direction (vertical direction), similarly to the first embodiment illustrated in FIGS. 7A and 7B, the pixel interval of the same color becomes the repetition of one-pixel interval (1P) and two-pixel interval (2P). Therefore, it is possible to perform reproduction at higher quality than a case where the color imaging element or the like of PTL 4 is used.

Here, the RGB filters 23R, 23G and 23B in the respective RGB filter arrays 56 to 58 forming a basic array pattern may be arbitrarily changed within a range that satisfies above-mentioned features (2) to (4), (5") and (6).

Figure 19:
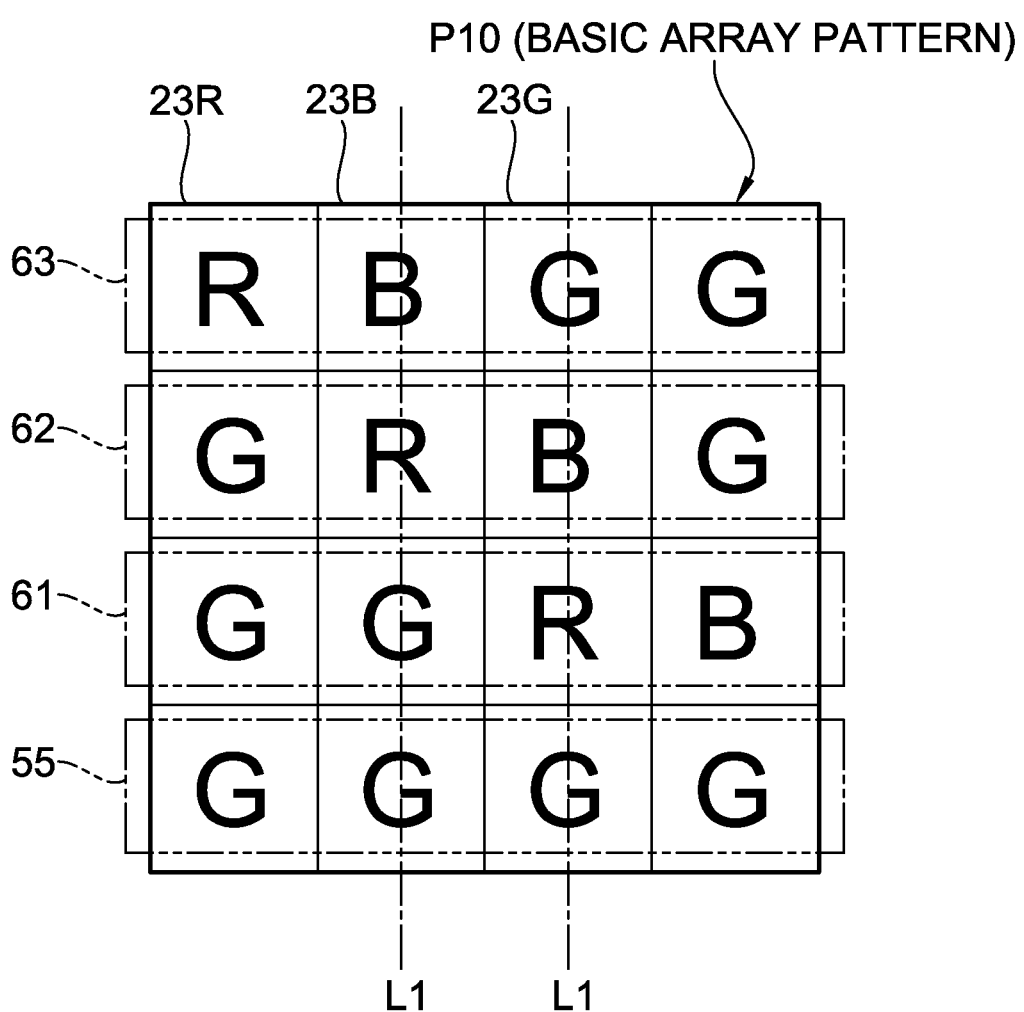
FIG. 19 is an explanatory diagram to describe a first modification of the basic array pattern illustrated in FIG. 18.

For example, a basic array pattern P10 illustrated in FIG. 19 includes the G filter array 55, a first RGB filter array 61, a second RGB filter array 62 and a third RGB filter array 63. The R filter 23R and the B filter 23B are disposed so as to be adjacent to each other in the respective RGB filter arrays 61 to 63. In addition, respective positions of the RB filters 23R and 23B in the respective RGB filter arrays 61 to 63 are shifted by one-pixel interval in the horizontal direction (H) every line and disposed. That is, the basic array pattern P10 denotes an array pattern formed by enlarging the size of the basic array pattern P1 of the first embodiment.

Figure 20:
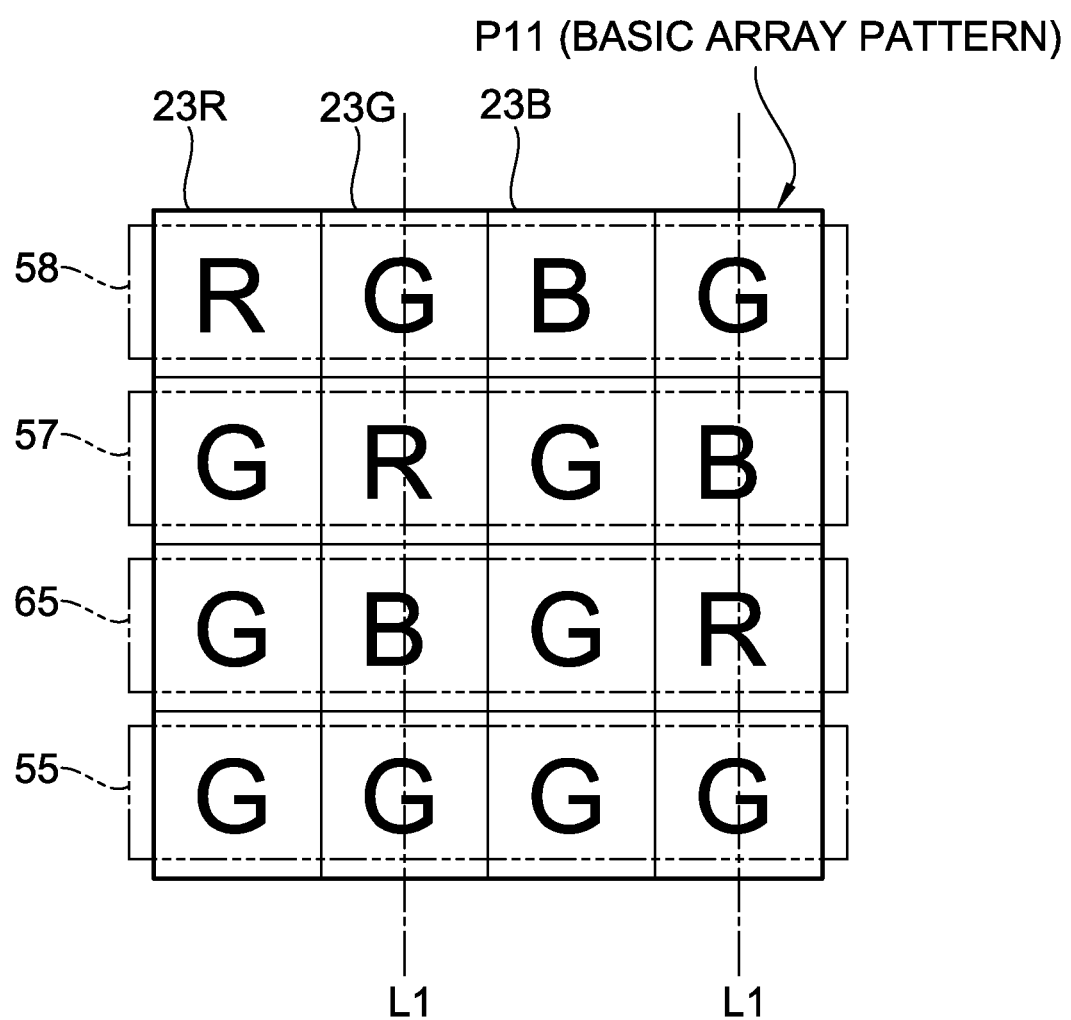
FIG. 20 is an explanatory diagram to describe a second modification of the basic array pattern illustrated in FIG. 18.

Moreover, a basic array pattern P11 illustrated in FIG. 20 has the same configuration as the basic array pattern P9 except for that it includes a first RGB filter array 65 different from the basic array pattern P9. The first RGB filter array 65 denotes an array in which the position relationship of the RB filters 23R and 238 in the second RGB filter array 57 is reversed.

Since even a color filer array formed with such basic array patterns P10 and P11 satisfies above-mentioned features (1) to (4), (5") and (6), an effect similar to a case where the color filter array 54 is used is acquired. Here, for example, like the color filter array 30 illustrated in FIG. 8, the G filter array 55 may be set between respective RGB filter arrays though the illustration is omitted.

[Others]

A color filter array formed with color filters of primary colors RGB has been described in the above-mentioned first embodiment and so on, but, for example, the present invention is applicable even to a color filter array of complementary color filters of four colors adding G to C (cyan), M (magenta), and Y (yellow) which are complementary colors of primary colors RGB. Even in this case, a color filter that satisfies any of above-mentioned conditions (1) to (4) is assumed to be the first filter of the present invention and the other color filters are assumed to be the second filter.

Here, it is needless to say that the color filter array of the color imaging element of the present invention is not limited to the abovementioned embodiments and various changes are possible without departing from the spirit of the present invention. For example, the color filter arrays of the above-mentioned respective embodiments may be arbitrarily combined. Moreover, a combination of at least two kinds among the G filter 23G, the transparent filter 23W, the first and second G filters 23G1 and 23G2, the E filter 23E and so on may be used as the first filter of the present invention, or other color filters that satisfy any of above-mentioned conditions (1) to (4) may be used. In addition, other color filters than the RB filters 23R and 23B may be used as the second filter of the present invention.

A case has been described in the above-mentioned respective embodiments where the basic array pattern has an array pattern corresponding to 3×3 pixels or an array pattern corresponding to 4×4 pixels, but the basic array pattern may be an array pattern corresponding to N×N (N is a natural number equal to or greater than 3) pixels. Here, it is preferable that N is equal to or less than 4, and it is more preferable that N is equal to 3. As mentioned above, it is because signal processing such as demosaicing becomes complicated when the size of the basic array pattern becomes large while a special effect by enlarging the size cannot be acquired.

A color imaging element mounted to a digital camera has been described in the above-mentioned respective embodiments, but the present invention is applicable to a color imaging element mounted to various kinds of electronic equipment (imaging devices) having a photograph function such as a smart phone, a mobile telephone and a PDA.

What is claimed is:

1. A single-plate color imaging element including:
   multiple pixels including photoelectric conversion elements arrayed in a first direction and a second direction which is perpendicular to the first direction; and
   color filters which are respectively arrayed on the multiple pixels,
   wherein: an array of the color filters includes a basic array pattern in which the color filters are arrayed in an array pattern corresponding to N×N (N is a natural number equal to or greater than 3) pixels in the first direction and the second direction, and the array is formed by repeatedly disposing the basic array pattern in the first direction and the second direction;
   the color filters include a first filter corresponding to a first color of one or more colors and second filters corresponding to second colors of two or more colors whose contribution ratio to acquire a brightness signal is lower than that of the first color, and a ratio of all pixel numbers of the first color corresponding to the first filter is larger than a ratio of a pixel number of each color of the second colors corresponding to the second filters;
   the basic array pattern includes a first filter array of one line formed by arraying the first filter along the first direction and second filter arrays of two or more lines formed by arraying the first filter and the second filter corresponding to each color of the second colors along the first direction;

one or more first filters are disposed in a filter line in each direction including the first direction and the second direction of the array of the color filters, and a third direction and a fourth direction that incline to the first direction and the second direction; and one or more second filters of at least one color among each color of the second colors are disposed in a filter line in the second direction of the basic array pattern, wherein: a position of the second filter of an identical color in each of the second filter array of two lines of the basic array pattern is shifted by one-pixel interval in the first direction and disposed; and in at least one filter line among each filter line in the second direction in the basic array pattern, one or more second filters corresponding to each color of the second colors are disposed.

2. A single-plate color imaging element including:

multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is a natural number equal to or greater than 3) pixels in the first direction and the second direction, and the array is formed by repeatedly disposing the basic array pattern in the first direction and the second direction;

the color filters include a first filter corresponding to a first color of one or more colors and second filters corresponding to second colors of two or more colors whose contribution ratio to acquire a brightness signal is lower than that of the first color, and a ratio of all pixel numbers of the first color corresponding to the first filter is larger than a ratio of a pixel number of each color of the second colors corresponding to the second filters;

the basic array pattern includes a first filter array of one line formed by arraying the first filter along the first direction and second filter arrays of two or more lines formed by arraying the first filter and the second filter corresponding to each color of the second colors along the first direction;

one or more first filters are disposed in a filter line in each direction including the first direction and the second direction of the array of the color filters, and a third direction and a fourth direction that incline to the first direction and the second direction; and one or more second filters of at least one color among each color of the second colors are disposed in a filter line in the second direction of the basic array pattern, wherein the array of the color filters includes two kinds of the basic array patterns in which a position relationship of the second filter of each color of the second colors is reversed, and the array is formed by disposing these two kinds of the basic array patterns in each direction of the first direction and the second direction alternately and repeatedly.

3. The color imaging element according to claim 1, wherein a contribution ratio of the first color to acquire a brightness signal is equal to or greater than 50% and a contribution ratio of the second colors to acquire the brightness signal is less than 50%.

4. The color imaging element according to claim 1, wherein the second filters of different colors are disposed so as to be adjacent to the first direction in the second filter array.

5. The color imaging element according to claim 1, wherein, when the color filter is a square shape, the third direction and the fourth direction are different by 45° with respect to the first direction and the second direction respectively.

6. The color imaging element according to claim 1, wherein the first colors include at least any of green and transparency.

7. The color imaging element according to claim 1, wherein the second colors include red and blue.

8. An imaging device comprising:

an imaging optical system;

a color imaging element in which an object image is formed through the imaging optical system; and an image data generation unit configured to generate image data of the formed object image, wherein the color imaging element is a color imaging element according to claim 1.

* * * * *